United States Patent
Kishi

(10) Patent No.: US 9,466,239 B2
(45) Date of Patent: Oct. 11, 2016

(54) CURRENT DRIVE TYPE DISPLAY DEVICE AND DRIVE METHOD THEREOF

(71) Applicant: Sharp Kabushiki Kaisha, Osaka (JP)

(72) Inventor: Noritaka Kishi, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 115 days.

(21) Appl. No.: 14/358,720

(22) PCT Filed: Nov. 9, 2012

(86) PCT No.: PCT/JP2012/079103
§ 371 (c)(1),
(2) Date: May 15, 2014

(87) PCT Pub. No.: WO2013/073467
PCT Pub. Date: May 23, 2013

(65) Prior Publication Data
US 2014/0306945 A1 Oct. 16, 2014

(30) Foreign Application Priority Data
Nov. 17, 2011 (JP) .................................. 2011-252114

(51) Int. Cl.
*G09G 3/30* (2006.01)
*G09G 3/32* (2016.01)
*H01L 27/32* (2006.01)

(52) U.S. Cl.
CPC .............. *G09G 3/30* (2013.01); *G09G 3/3233* (2013.01); *G09G 2300/0819* (2013.01); *G09G 2300/0842* (2013.01); *G09G 2300/0866* (2013.01); *G09G 2310/0218* (2013.01); *H01L 27/3244* (2013.01)

(58) Field of Classification Search
CPC .......................................... G09G 3/30–3/3291
See application file for complete search history.

(56) References Cited

U.S. PATENT DOCUMENTS 7,408,533 B2 * 8/2008 Eom .................... G09G 3/3233
  315/169.3
2004/0174354 A1 * 9/2004 Ono ..................... G09G 3/3233
  345/204

(Continued)

FOREIGN PATENT DOCUMENTS

JP   2004-280059 A   10/2004
JP   2007-148129 A    6/2007

(Continued)

OTHER PUBLICATIONS

International Search Report received for PCT Patent Application No. PCT/JP2012/079103, mailed on Feb. 12, 2013, 5 pages (3 pages of English translation and 2 pages of ISR).

*Primary Examiner* — Gene W Lee
(74) *Attorney, Agent, or Firm* — Morrison & Foerster LLP

(57) ABSTRACT

A pixel circuit 10 includes four TFTs 11 to 14, a capacitor 15, and an organic EL element 16. Between a node A where the TFT 11 and the capacitor 15 are connected and a power supply line VPk, the TFT 14 is provided in place of a capacitor. The gate terminal of the TFT 14 is connected to a control line Ek. The TFT 14 is in an on state in a light emission period of the organic EL element 16. The power supply line VPk and control lines Ek and AZk are connected to the pixel circuits 10 in a plurality of rows. A display device simultaneously performs initialization to the pixel circuits 10 in the plurality of rows, simultaneously performs threshold detection to the pixel circuits 10 in the plurality of rows, sequentially writes data to the pixel circuits 10 row by row, and makes organic EL elements 16 included in the pixel circuits 10 in the plurality of rows emit light in the same period.

6 Claims, 21 Drawing Sheets

(56) References Cited

U.S. PATENT DOCUMENTS

| | | |
|---|---|---|
| 2007/0115225 A1 | 5/2007 | Uchino et al. |
| 2009/0051628 A1* | 2/2009 | Kwon .................. G09G 3/3233 345/77 |
| 2010/0020065 A1* | 1/2010 | Takasugi .............. G09G 3/3233 345/214 |
| 2010/0045646 A1 | 2/2010 | Kishi |
| 2011/0025586 A1 | 2/2011 | Lee |
| 2011/0025671 A1 | 2/2011 | Lee |
| 2011/0128211 A1* | 6/2011 | Ono .................... H01L 27/3265 345/76 |
| 2012/0007848 A1* | 1/2012 | Han ..................... G09G 3/3233 345/212 |
| 2012/0249615 A1 | 10/2012 | Lee |

FOREIGN PATENT DOCUMENTS

| | | |
|---|---|---|
| JP | 2011-34038 A | 2/2011 |
| JP | 2011-34039 A | 2/2011 |
| JP | 2012-208459 A | 10/2012 |

* cited by examiner

CURRENT DRIVE TYPE DISPLAY DEVICE AND DRIVE METHOD THEREOF

CROSS REFERENCE TO RELATED APPLICATIONS

This is the U.S. National Phase patent application of PCT/JP2012/079103, filed Nov. 9, 2012, which claims priority to Japanese Patent Application No. 2011-252114, filed Nov. 17, 2011, each of which is hereby incorporated by reference in the present disclosure in its entirety.

TECHNICAL FIELD

The present invention relates to a display device and, more specifically, to a current drive type display device such as an organic EL display and a drive method of the same.

BACKGROUND ART

As a thin, high picture quality, and low power consumption display device, an organic EL (Electro Luminescence) display has been known. The organic EL display has a plurality of pixel circuits each including an organic EL element, a drive transistor, and a control transistor. As transistors in each pixel circuit, thin film transistors (hereinbelow, referred to as TFTs) are used.

In an organic EL display, variation occurs in a threshold voltage and a mobility of a drive transistor in a pixel circuit. Due to this, even when the same data potential is written to the pixel circuits, variation occurs in the amount of current flowing through the organic EL elements. Since the brightness of the organic EL element changes depending on the amount of current flowing through the organic EL element, when variation occurs in the amount of current flowing through the organic EL element, brightness unevenness occurs in a display screen. Therefore, to perform high-quality display in the organic EL display, a characteristic of the drive transistor has to be compensated. An organic EL display in which a characteristic of a drive transistor is compensated is described in, for example, Patent Document 1.

Another organic EL display has also been known in which all of organic EL elements emit light in the same period (for example, Patent Documents 2 and 3). In organic EL displays described in Patent Documents 2 and 3, at the head of one frame period, initialization is simultaneously performed to all of pixel circuits and threshold detection is simultaneously performed to all of the pixel circuits, next, data is sequentially written to the pixel circuits row by row, and organic EL elements included in all of the pixel circuits are made to emit light in the same period. FIG. 24 is a circuit diagram of a pixel circuit described in Patent Document 3. The pixel circuit illustrated in FIG. 24 includes TFTs 91 to 93, capacitors 94 and 95, and an organic EL element 96. The TFT 92 functions as a drive transistor.

PRIOR ART DOCUMENTS

Patent Documents

[Patent Document 1] Japanese Laid-Open Patent Publication No. 2007-148129
[Patent Document 2] Japanese Laid-Open Patent Publication No. 2011-34038
[Patent Document 3] Japanese Laid-Open Patent Publication No. 2011-34039

SUMMARY OF THE INVENTION

Problems to be Solved by the Invention

In pixel circuits of an organic EL display, the node potential in the pixel circuits has to be maintained except for the time of initialization, threshold detection, and data writing. In the pixel circuit illustrated in FIG. 24, the gate-source voltage of the TFT 92 is held by the two capacitors 94 and 95 connected in series in a light emission period. However, since the combined capacitance of the capacitors 94 and 95 connected in series is small, when leak current flows through the TFTs 91 and 93, the gate potential of the TFT 92 easily fluctuates. As a countermeasure, there is a method of enlarging the size of the capacitors 94 and 95 to increase a capacitance value. When the size of the capacitors 94 and 95 is enlarged, however, the layout area of the pixel circuit increases, and it becomes disadvantageous from the viewpoint of higher definition and yield.

Therefore, an object of the present invention is to provide a display device in which the layout area of a pixel circuit is small and light emitting elements in pixel circuits in a plurality of rows are made to emit light in the same period.

Means for Solving the Problems

According to a first aspect of the present invention, there is provided a current drive type display device, including: a plurality of pixel circuits each including a light emitting element and disposed in a row direction and a column direction; a plurality of scanning signal lines each connected to the pixel circuits in the same row; a plurality of data signal lines each connected to the pixel circuits in the same column; one or more control lines each connected to the pixel circuits in a plurality of rows; one or more power supply lines each connected to the pixel circuits in the plurality of rows; a drive circuit driving the scanning signal lines, the data signal lines, and the control line(s); and a power supply circuit selectively applying a plurality of potentials to the power supply line(s), wherein the drive circuit and the power supply circuit simultaneously perform initialization to the pixel circuits in the plurality of rows, simultaneously perform threshold detection to the pixel circuits in the plurality of rows, sequentially write data to the pixel circuits row by row, and perform a control to make the light emitting elements included in the pixel circuits in the plurality of rows emit light in the same period, and each of the pixel circuits further includes: a drive transistor having one conduction terminal connected to the power supply line, and the other conduction terminal connected to one end of the light emitting element; a capacitor having one end connected to a control terminal of the drive transistor; a write control transistor provided between the other end of the capacitor and the data signal line, and having a control terminal connected to the scanning signal line; a threshold detection transistor provided between the control terminal and the conduction terminal on the light emitting element side of the drive transistor; and a power supply connection transistor provided between the other end of the capacitor and the power supply line or another power supply line having a predetermined potential, and having a control terminal connected to the control line.

According to a second aspect of the present invention, in the first aspect of the present invention, the display device further includes one or more second control lines each connected to the pixel circuits in the plurality of rows, wherein a control terminal of the threshold detection transistor is connected to the second control line, the other end of the light emitting element is connected to a conductive member having a fixed common potential, and the power supply circuit selectively applies three kinds of potentials to the power supply line(s).

According to a third aspect of the present invention, in the second aspect of the present invention, the pixel circuit is controlled such that in a former part of an initialization period, the write control transistor is in an on state, the power supply connection transistor is in an off state, and a first potential substantially equal to the common potential is applied to the power supply line, in a latter part of the initialization period, the write control transistor is in the on state, the power supply connection transistor is in the off state, a potential with which the drive transistor enters an on state is applied to the data signal line, and a second potential for initialization is applied to the power supply line, in a threshold detection period, the write control transistor and the threshold detection transistor are in an on state, the power supply connection transistor is in the off state, a potential for threshold detection is applied to the data signal line, and the first potential is applied to the power supply line, in a period from completion of threshold detection to start of data writing and a period from completion of data writing to start of light emission, the write control transistor and the power supply connection transistor are in the off state, in a data writing period, the write control transistor and the threshold detection transistor are in the on state, the power supply connection transistor is in the off state, and a data potential is applied to the data signal line, and in a light emission period, the write control transistor and the threshold detection transistor are in an off state, the power supply connection transistor is in an on state, and a third potential for light emission is applied to the power supply line.

According to a fourth aspect of the present invention, in the first aspect of the present invention, the display device further includes: one or more second control lines each connected to the pixel circuits in the plurality of rows; and one or more second power supply lines each connected to the pixel circuits in the plurality of rows, wherein a control terminal of the threshold detection transistor is connected to the second control line, the other end of the light emitting element is connected to the second power supply line, and the power supply circuit selectively applies two kinds of potentials to the power supply line(s) and the second power supply line(s) respectively.

According to a fifth aspect of the present invention, in the fourth aspect of the present invention, the pixel circuit is controlled such that in a former part of an initialization period, the write control transistor is in an on state, the power supply connection transistor is in an off state, and a first potential is applied to the power supply line and the second power supply line, in a latter part of the initialization period, the write control transistor is in the on state, the power supply connection transistor is in the off state, a potential with which the drive transistor enters an on state is applied to the data signal line, the first potential is applied to the power supply line, and a second potential for initialization is applied to the second power supply line, in a threshold detection period, the write control transistor and the threshold detection transistor are in an on state, the power supply connection transistor is in the off state, a potential for threshold detection is applied to the data signal line, and the first potential is applied to the power supply line and the second power supply line, in a period from completion of threshold detection to start of data writing and a period from completion of data writing to start of light emission, the write control transistor and the power supply connection transistor are in the off state, in a data writing period, the write control transistor and the threshold detection transistor are in the on state, the power supply connection transistor is in the off state, and a data potential is applied to the data signal line, and in a light emission period, the write control transistor and the threshold detection transistor are in an off state, the power supply connection transistor is in an on state, a third potential for light emission is applied to the power supply line, and the first potential is applied to the second power supply line.

According to a sixth aspect of the present invention, in the first aspect of the present invention, a control terminal of the threshold detection transistor is connected to the scanning signal line, the other end of the light emitting element is connected to a conductive member having a fixed common potential, and the power supply circuit selectively applies three kinds of potentials to the power supply line(s).

According to a seventh aspect of the present invention, in the sixth aspect of the present invention, the pixel circuit is controlled such that in a former part of an initialization period, the write control transistor and the threshold detection transistor are in an on state, the power supply connection transistor is in an off state, and a first potential substantially equal to the common potential is applied to the power supply line, in a latter part of the initialization period, the write control transistor and the threshold detection transistor are in an off state, the power supply connection transistor is in an on state, and a second potential for initialization is applied to the power supply line, in a threshold detection period, the write control transistor and the threshold detection transistor are in the on state, the power supply connection transistor is in the off state, a potential for threshold detection is applied to the data signal line, and the first potential is applied to the power supply line, in a period from completion of threshold detection to start of data writing and a period from completion of data writing to start of light emission, the write control transistor, the threshold detection transistor, and the power supply connection transistor are in the off state, in a data writing period, the write control transistor and the threshold detection transistor are in the on state, the power supply connection transistor is in the off state, and a data potential is applied to the data signal line, and in a light emission period, the write control transistor and the threshold detection transistor are in the off state, the power supply connection transistor is in the on state, and a third potential for light emission is applied to the power supply line.

According to an eighth aspect of the present invention, there is provided a drive method of a current drive type display device including a plurality of pixel circuits disposed in a row direction and a column direction, a plurality of scanning signal lines each connected to the pixel circuits in the same row, a plurality of data signal lines each connected to the pixel circuits in the same column, one or more control lines each connected to the pixel circuits in a plurality of rows, and one or more power supply lines each connected to the pixel circuits in the plurality of rows, each of the pixel circuits including a light emitting element, a drive transistor having one conduction terminal connected to the power supply line, and the other conduction terminal connected to one end of the light emitting element, a capacitor having one end connected to a control terminal of the drive transistor, a write control transistor provided between the other end of the capacitor and the data signal line, and having a control terminal connected to the scanning signal line, a threshold detection transistor provided between the control terminal and the conduction terminal on the light emitting element side of the drive transistor; and a power supply connection transistor provided between the other end of the capacitor and the power supply line or another power supply line having a predetermined potential, and having a control terminal connected to the connection line, the method including: a driving step of driving the scanning signal lines, the data signal lines, and the control line(s); and a power supply control step of selectively applying a plurality of potentials to the power supply line(s), wherein in the driving step and the power supply control step, initialization is simultaneously performed to the pixel circuits in the plurality of rows, threshold detection is simultaneously performed to the pixel circuits in the plurality of rows, data is sequentially written to the pixel circuits row by row, and a control is performed to make the light emitting elements included in the pixel circuits in the plurality of rows emit light in the same period.

According to a ninth aspect of the present invention, in the eighth aspect of the present invention, the display device further includes one or more second control lines each connected to the pixel circuits in the plurality of rows, a control terminal of the threshold detection transistor is connected to the second control line, the other end of the light emitting element is connected to a conductive member having a fixed common potential, and in the power supply control step, three kinds of potentials are selectively applied to the power supply line(s).

According to a tenth aspect of the present invention, in the ninth aspect of the present invention, in the drive step and the power supply control step, the pixel circuit is controlled such that in a former part of an initialization period, the write control transistor is in an on state, the power supply connection transistor is in an off state, and a first potential substantially equal to the common potential is applied to the power supply line, in a latter part of the initialization period, the write control transistor is in the on state, the power supply connection transistor is in the off state, a potential with which the drive transistor enters an on state is applied to the data signal line, and a second potential for initialization is applied to the power supply line, in a threshold detection period, the write control transistor and the threshold detection transistor are in an on state, the power supply connection transistor is in the off state, a potential for threshold detection is applied to the data signal line, and the first potential is applied to the power supply line, in a period from completion of threshold detection to start of data writing and a period from completion of data writing to start of light emission, the write control transistor and the power supply connection transistor are in the off state, in a data writing period, the write control transistor and the threshold detection transistor are in the on state, the power supply connection transistor is in the off state, and a data potential is applied to the data signal line, and in a light emission period, the write control transistor and the threshold detection transistor are in an off state, the power supply connection transistor is in an on state, and a third potential for light emission is applied to the power supply line.

According to an eleventh aspect of the present invention, in the eighth aspect of the present invention, the display device further includes one or more second control lines each connected to the pixel circuits in the plurality of rows, and one or more second power supply lines each connected to the pixel circuits in the plurality of rows, a control terminal of the threshold detection transistor is connected to the second control line, the other end of the light emitting element is connected to the second power supply line, and in the power supply control step, two kinds of potentials are selectively applied to the power supply line(s) and the second power supply line(s) respectively.

According to a twelfth aspect of the present invention, in the eleventh aspect of the present invention, in the drive step and the power supply control step, the pixel circuit is controlled such that in a former part of an initialization period, the write control transistor is in an on state, the power supply connection transistor is in an off state, and a first potential is applied to the power supply line and the second power supply line, in a latter part of the initialization period, the write control transistor is in the on state, the power supply connection transistor is in the off state, a potential with which the drive transistor enters an on state is applied to the data signal line, the first potential is applied to the power supply line, and a second potential for initialization is applied to the second power supply line, in a threshold detection period, the write control transistor and the threshold detection transistor are in an on state, the power supply connection transistor is in the off state, a potential for threshold detection is applied to the data signal line, and the first potential is applied to the power supply line and the second power supply line, in a period from completion of threshold detection to start of data writing and a period from completion of data writing to start of light emission, the write control transistor and the power supply connection transistor are in the off state, in a data writing period, the write control transistor and the threshold detection transistor are in the on state, the power supply connection transistor is in the off state, and a data potential is applied to the data signal line, and in a light emission period, the write control transistor and the threshold detection transistor are in an off state, the power supply connection transistor is in an on state, a third potential for light emission is applied to the power supply line, and the first potential is applied to the second power supply line.

According to a thirteenth aspect of the present invention, in the eighth aspect of the present invention, a control terminal of the threshold detection transistor is connected to the scanning signal line, the other end of the light emitting element is connected to a conductive member having a fixed common potential, and in the power supply control step, three kinds of potentials are selectively applied to the power supply line(s).

According to a fourteenth aspect of the present invention, in the thirteenth aspect of the present invention, in the drive step and the power supply control step, the pixel circuit is controlled such that in a former part of an initialization period, the write control transistor and the threshold detection transistor are in an on state, the power supply connection transistor is in an off state, and a first potential substantially equal to the common potential is applied to the power supply line, in a latter part of the initialization period, the write control transistor and the threshold detection transistor are in an off state, the power supply connection transistor is in an on state, and a second potential for initialization is applied to the power supply line, in a threshold detection period, the write control transistor and the threshold detection transistor are in the on state, the power supply connection transistor is in the off state, a potential for threshold detection is applied to the data signal line, and the first potential is applied to the power supply line, in a period from completion of threshold detection to start of data writing and a period from completion of data writing to start of light emission, the write control transistor, the threshold detection transistor, and the power supply connection transistor are in the off state, in a data writing period, the write control transistor and the threshold detection transistor are in the on state, the power supply connection transistor is in the off state, and a data potential is applied to the data signal line, and in a light emission period, the write control transistor and the threshold detection transistor are in the off state, the power supply connection transistor is in the on state, and a third potential for light emission is applied to the power supply line.

Effects of the Invention

According to the first or eighth aspect of the present invention, a display device which simultaneously performs initialization to pixel circuits in a plurality of rows, simultaneously performs threshold detection to the pixel circuits in the plurality of rows, sequentially writes data to the pixel circuits row by row, and makes light emitting elements included in the pixel circuits in the plurality of rows emit light in the same period can be configured by using the pixel circuit including four transistors, one capacitor, and a light emitting element. Thus, the display device in which the layout area of the pixel circuit is small and the light emitting elements in the pixel circuits in the plurality of rows are made to emit light in the same period can be obtained.

According to the second, third, ninth, or tenth aspect of the present invention, a display device in which light emitting elements in pixel circuits in a plurality of rows are made to emit light in the same period can be configured by using two kinds of control lines each connected to the pixel circuits in the plurality of rows and one kind of power supply line(s) each connected to the pixel circuits in the plurality of rows. By using one kind of power supply line(s), the layout area of the power supply lines can be decreased.

According to the fourth, fifth, eleventh, or twelfth aspect of the present invention, a display device in which light emitting elements in pixel circuits in a plurality of rows are made to emit light in the same period can be configured by using two kinds of control lines each connected to the pixel circuits in the plurality of rows and two kinds of power supply lines each connected to the pixel circuits in the plurality of rows. By using the power supply circuit which selectively applies two kinds of potentials, the configuration of the power supply circuit can be made simple.

According to the sixth, seventh, thirteenth, or fourteenth aspect of the present invention, a display device in which light emitting elements in pixel circuits in a plurality of rows are made to emit light in the same period can be configured by using one kind of control line(s) each connected to the pixel circuits in the plurality of rows and one kind of power supply line(s) each connected to the pixel circuits in the plurality of rows. By using one kind of the control line(s) and one kind of the power supply line(s), the layout area of the control line and the power supply line can be reduces, and the configuration of the drive circuit can be made simple.

MODES FOR CARRYING OUT THE INVENTION

First Embodiment

Figure 1:
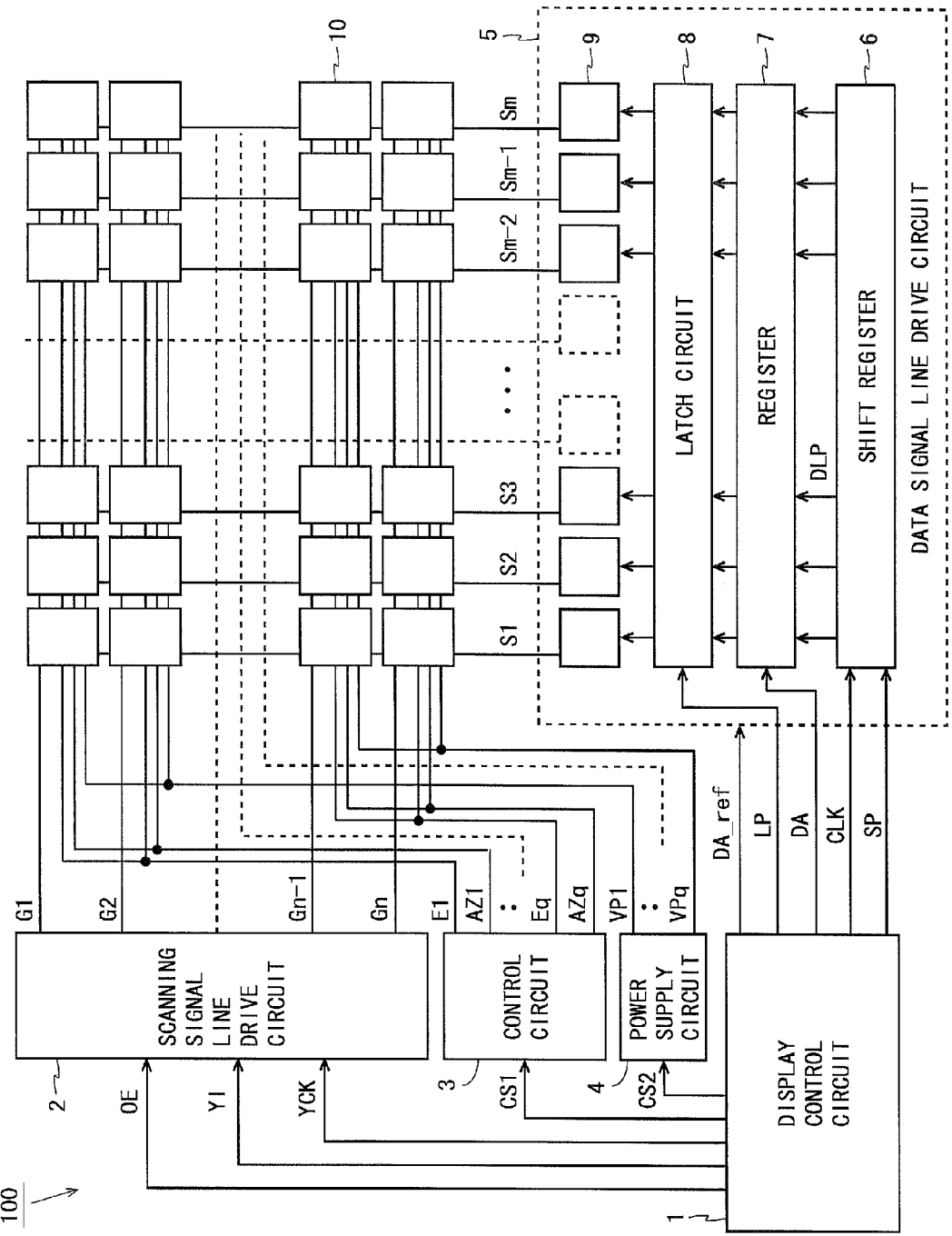
FIG. 1 is a block diagram illustrating a configuration of a display device according to a first embodiment of the present invention.

FIG. 1 is a block diagram illustrating a configuration of a display device according to a first embodiment of the present invention. A display device 100 illustrated in FIG. 1 is an organic EL display having a display control circuit 1, a scanning signal line drive circuit 2, a control circuit 3, a power supply circuit 4, a data signal line drive circuit 5, and (m×n) pieces of pixel circuits 10. The organic EL display is a kind of a current drive type display device. Hereinbelow, each of m and n is an integer of two or larger, each of i and q is an integer which is equal to or larger than one and is equal to or smaller than n, j is an integer which is equal to or larger than one and equal to or smaller than m, and k is an integer which is equal to or larger than one and is equal to or smaller than q.

The display device 100 is provided with n pieces of scanning signal lines G1 to Gn and m pieces of data signal lines S1 to Sm. The scanning signal lines G1 to Gn are disposed in parallel to one another, and the data signal lines S1 to Sm are disposed in parallel to one another so as to intersect with the scanning signal lines G1 to Gn perpendicularly. The pixel circuit 10 is disposed in the vicinity of each of cross points of the scanning signal lines G1 to Gn and the data signal lines S1 to Sm. In such a manner, the (m×n) pieces of pixel circuits 10 are disposed two-dimensionally. The scanning signal line Gi is connected to m pieces of pixel circuits 10 disposed in the i-th row, and the data signal line Sj is connected to n pieces of pixel circuits 10 disposed in the j-th column. The display device 100 is also provided with q pieces of control lines E1 to Eq, q pieces of control lines AZ1 to AZq, and q pieces of power supply lines VP1 to VPq. The pixel circuits 10 in each row are connected to one of the control lines E1 to Eq, one of the control lines AZ1 to AZq, and one of the power supply lines VP1 to VPq. To the pixel circuit 10, a common potential Vcom is supplied by using a not-illustrated conductive member (electrode).

The display control circuit 1 outputs control signals to the scanning signal line drive circuit 2, the control circuit 3, the power supply circuit 4, and the data signal line drive circuit 5. More specifically, the display control circuit 1 outputs a timing signal GE, a start pulse YI, and a clock YCK to the scanning signal line drive circuit 2, outputs a control signal CS1 to the control circuit 3, outputs a control signal CS2 to the power supply circuit 4, and outputs a start pulse SP, a clock CLK, a data signal DA, a latch pulse LP, and a reference signal DA_ref to the data signal line drive circuit 5. The data signal DA and the reference signal DA_ref are analog signals. The reference signal DA_ref has a predetermined reference potential.

The scanning signal line drive circuit 2 drives the scanning signal lines G1 to Gn. More specifically, the scanning signal line drive circuit 2 includes a shift register circuit, an logic operation circuit, and buffers (which are not illustrated). The shift register circuit sequentially transfers the start pulse YI in synchronization with the clock YCK. The logic operation circuit performs a logic operation between a pulse output from each of stages in the shift register circuit and the timing signal GE. The output of the logic operation circuit is supplied to the corresponding scanning signal line Gi via the buffer. With this, m pieces of pixel circuits 10 connected to the scanning signal line Gi are selected collectively.

The control circuit 3 selectively applies a high-level potential and a low-level potential to the control lines E1 to Eq and AZ1 to AZq based on the control signal CS1. The power supply circuit 4 selectively applies three kinds of potentials to the power supply lines VP1 to VPq based on the control signal CS2. More specifically, the power supply circuit 4 selectively applies a potential to each of the power supply lines VP1 to VPq, the potential being selected from among a potential VP_H higher than the common potential Vcom, a potential VP_C substantially equal to Vcom, and a potential VP_L lower than Vcom.

The data signal line drive circuit 5 drives the data signal lines S1 to Sm. More specifically, the data signal line drive circuit 5 includes a shift register 6 having m bits, a register 7, a latch circuit 8, and m pieces of output buffers 9. The shift register 6 has a configuration in which m pieces of registers are connected in multiple stages. The start pulse SP supplied to the register in the first stage is transferred synchronously with the clock CLK, and timing pulses DLP are output from the registers in the stages. At the output timings of the timing pulses DLP, the data signal DA is supplied to the register 7. The register 7 stores the data signal DA in accordance with the timing pulse DLP. When the data signals DA of one row are stored in the register 7, the display control circuit 1 outputs the latch pulse LP to the latch circuit 8. When the latch circuit 8 receives the latch pulse LP, the latch circuit 8 holds the data signals DA stored in the register 7. The m pieces of output buffers 9 are provided in correspondence with the data signal lines S1 to Sm. The output buffer 9 is typically an impedance conversion circuit such as a voltage follower. The output buffer 9 outputs, to the data signal line Sj, either one of the data signal DA held in the latch circuit 8 and the reference signal DA_ref output from the display control circuit 1.

Figure 2:
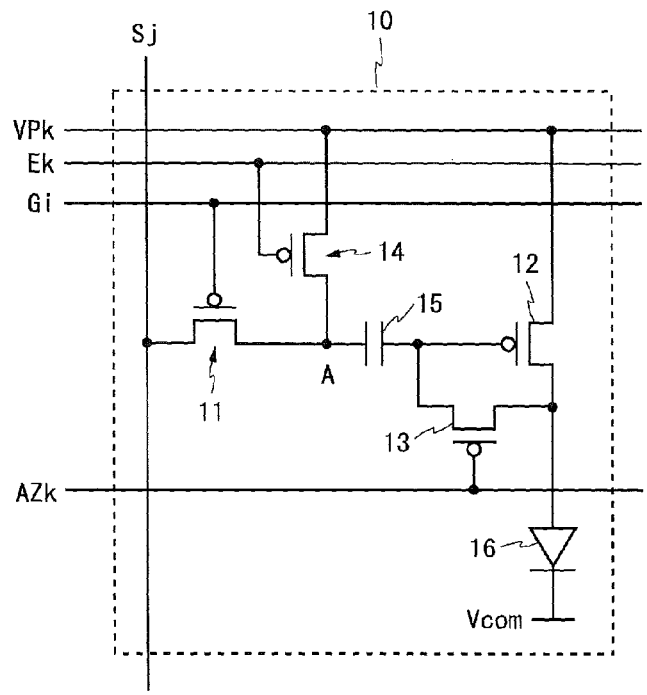
FIG. 2 is a circuit diagram of a pixel circuit included in the display device illustrated in FIG. 1.

FIG. 2 is a circuit diagram of the pixel circuit 10. As illustrated in FIG. 2, the pixel circuit 10 includes TFTs 11 to 14, a capacitor 15, and an organic EL element 16. Each of the TFTs 11 to 14 is a P-channel-type transistor. The pixel circuit 10 is connected to the scanning signal line Gi, the data signal line Sj, the control lines Ek and AZk, the power supply line VPk, and an electrode having the common potential Vcom.

One of conduction terminals of the TFT 11 is connected to the data signal line Sj, and the other conduction terminal is connected to one of terminals of the capacitor 15 (hereinbelow, called node A). The other terminal of the capacitor 15 is connected to the gate terminal of the TFT 12. The source terminal of the TFT 12 is connected to the power supply line VPk, and the drain terminal is connected to the anode terminal of the organic EL element 16. The cathode terminal of the organic EL element 16 is connected to the electrode having the common potential Vcom. The TFT 13 is provided between the gate terminal and the drain terminal (the conduction terminal on the organic EL element 16 side) of the TFT 12. The source terminal of the TFT 14 is connected to the power supply line VPk, and the drain terminal is connected to the node A. The gate terminal of the TFT 11 is connected to the scanning signal line Gi, the gate terminal of the TFT 13 is connected to the control line AZk, and the gate terminal of the TFT 14 is connected to the control line Ek. The TFTs 11 to 14 function as a write control transistor, a drive transistor, a threshold detection transistor, and a power supply connection transistor, respectively, and the organic EL element 16 functions as a light emitting element.

Figure 3:
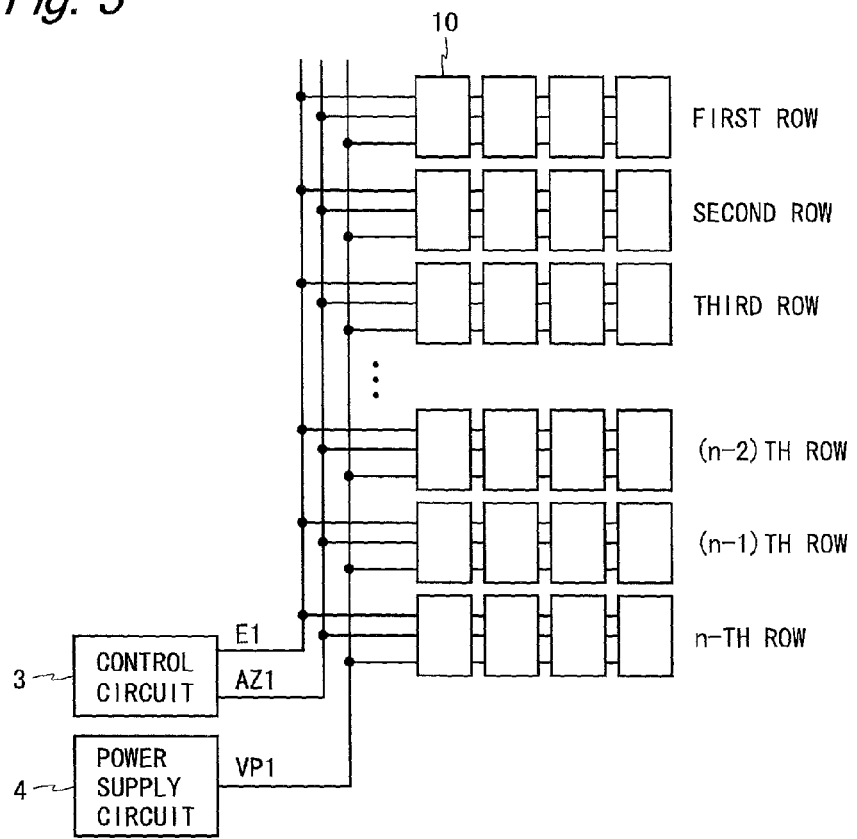
FIG. 3 is a diagram illustrating a connection form of control lines and a power supply line of the display device illustrated in FIG. 1.
Figure 4:
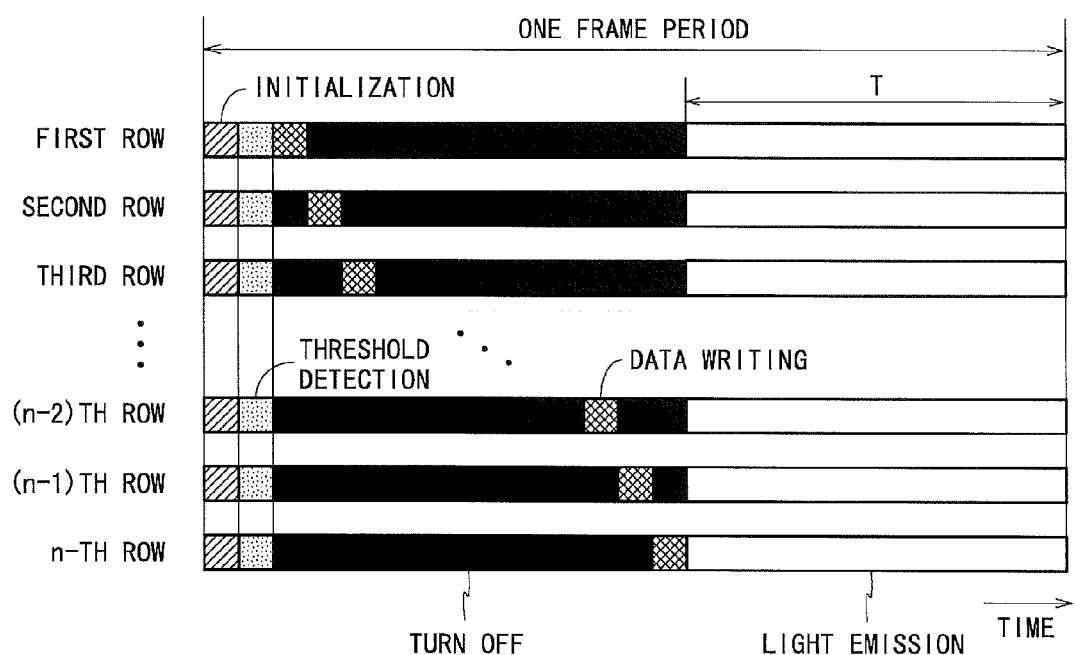
FIG. 4 is a diagram illustrating operations of pixel circuits in each row of the display device illustrated in FIG. 1.

Hereinbelow, the case where q=1 will be described. FIG. 3 is a diagram illustrating a connection form of the control lines and the power supply line in the case of q=1. In this case, all of the pixel circuits 10 are connected to the control lines E1 and AZ1 and the power supply line VP1. FIG. 4 is a diagram illustrating operations of the pixel circuits 10 in each row in the case of q=1. As illustrated in FIG. 4, an initialization period, a threshold detection period, a data writing period, a light emission period, and a turn off period are set in one frame period. The initialization period is a period of initializing the anode terminal of the organic EL element 16 after initializing the node in the pixel circuit 10. The threshold detection period is a period of applying the reference potential to the data signal line Sj and detecting a threshold voltage of the TFT 12. The data writing period is a period of applying a data potential (potential corresponding to the data signal DA) to the data signal line Sj and writing the data potential to the pixel circuit 10. Hereinbelow, a period from completion of threshold detection to start of data writing will be called a data standby period, a period from completion of data writing to start of light emission will be called a light emission standby period, and both of the periods will be called a standby period.

As illustrated in FIG. 4, at the head of one frame period, initialization and threshold detection are performed to all of the pixel circuits 10. Next, data writing to the pixel circuits 10 is sequentially performed row by row. After completion of data writing to all of the pixel circuits 10, the organic EL elements 16 in all of the pixel circuits 10 emit light for the same time T. The pixel circuits 10 have to complete light emission before initialization starts in the following frame period. While satisfying the condition, to adjust the light emission periods of all of the pixel circuits 10, the light emission period is, at the longest, a period obtained by excluding the initialization period, the threshold detection period, and n pieces of the data writing periods from one frame period.

Figure 5:
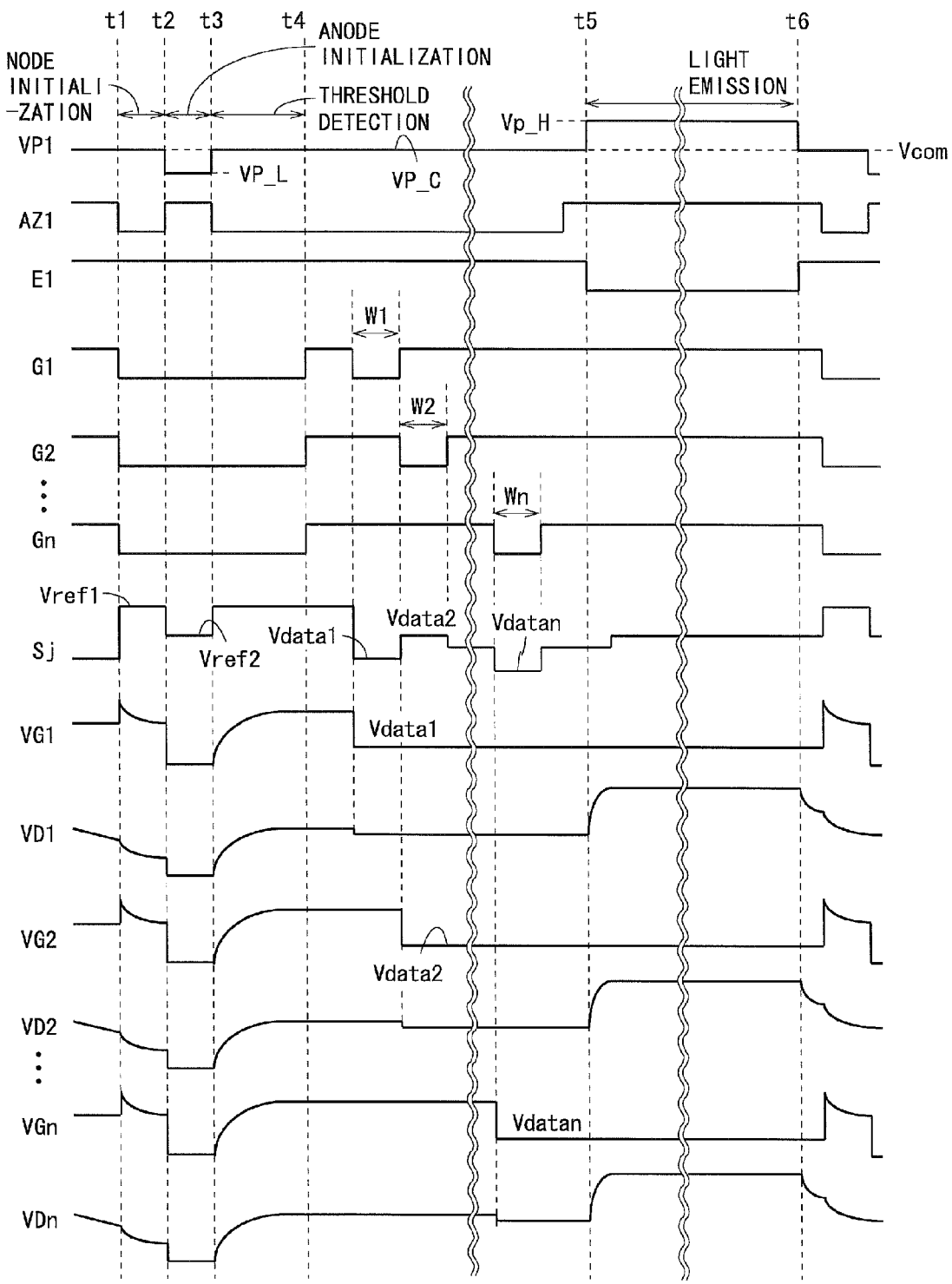
FIG. 5 is a timing chart of the display device illustrated in FIG. 1.

FIG. 5 is a timing chart illustrating the operations of the pixel circuits 10. In FIG. 5, Wi represents a data writing period of the pixel circuits 10 in the i-th row. VGi represents the gate potential of the TFT 12 in the pixel circuit 10 in the i-th row, and VDi represents the drain potential of the TFT 12 (that is, the anode potential of the organic EL element 16) in the pixel circuit 10 in the i-th row.

Hereinafter, with reference to FIG. 5, the operations of the pixel circuit 10 connected to the scanning signal line Gi, the data signal line Sj, the control lines E1 and AZ1, and the power supply line VP1 will be described. Before time t1, the potentials of the scanning signal line Gi and the control lines E1 and AZ1 are at the high level, and the potential of the power supply line VP1 is VP_C which is substantially equal to the common potential Vcom.

(a) Node Initialization

At time t1, the potentials of the scanning signal line Gi and the control line AZ1 change to the low level. With the change, the TFTs 11 and 13 change to an on state. Between time t1 and time t2, the potential of the power supply line VP1 remains VP_C which is substantially equal to the common potential Vcom, and the potential of the data signal line Sj becomes Vref1. Consequently, the potential of the node A becomes Vref1. The potential Vref1 is determined such that the TFT 11 enters an on state. At this time, the organic EL element 16 does not emit light, so that the anode potential of the organic EL element 16 and the gate potential of the TFT 12 become substantially equal to the common potential Vcom.

(b) Anode Initialization

At time t2, the potential of the control line AZ1 changes to the high level. With the change, the TFT 13 changes to an off state. Between time t2 and time t3, the potential of the power supply line VP1 becomes VP_L which is lower than the common potential Vcom, and the potential of the data signal line Sj becomes Vref2 which is lower than Vref1. At this time, the TFT 11 is in the on state and the TFTs 13 and 14 are in an off state. Consequently, when the potential of the data signal line Sj falls by (Vref1-Vref2), the gate potential of the TFT 12 falls by the same amount. Accordingly, the TFT 12 enters an on state, and electric charge stored at the anode terminal of the organic EL element 16 is discharged toward the power supply line VP1. As a result, the anode potential of the organic EL element 16 becomes VP_L.

(c) Threshold Detection

At time t3, the potential of the control line AZ1 changes to the low level. With the change, the TFT 13 changes to the on state. At time t3, the potential of the power supply line VP1 changes to VP_C which is substantially equal to the common potential Vcom. At this time, current flows from the power supply line VP1 into the gate terminal of the TFT 12 through the TFTs 12 and 13, and the gate potential of the TFT 12 rises. When the threshold voltage of the TFT 12 is assumed to be Vth, the gate potential of the TFT 12 rises to (VP_C+Vth). At time t3, the potential of the data signal line Sj changes to Vref1. At this time, since the TFT 11 remains in the on state, the potential of the node A changes to Vref1. On the other hand, the TFT 13 is in the on state at this time, and the organic EL element 16 has a capacitance value sufficiently larger than that of the capacitor 15. Consequently, even when the potential of the node A changes, the gate potential of the TFT 12 is hardly influenced.

(d) Data Standby

At time t4, the potential of the scanning signal line Gi changes to the high level. With the change, the TFT 11 changes to an off state. At this time point, the anode potential of the organic EL element 16 and the gate potential of the TFT 12 are (VP_C+Vth).

Ideally, in the data standby period, the current does not flow from the anode terminal of the organic EL element 16 to either of the organic EL element 16 side or the power supply line VP1 side, and the anode potential of the organic EL element 16 maintains at (VP_C+Vth). However, without any special contrivance, an unignorable degree of leak current flows through the TFT 12 in the data standby period, and the anode potential of the organic EL element 16 fluctuates. Therefore, it is preferable that the power supply circuit 4 sets the potential of the power supply line VP1 to VP_C which is substantially equal to the common potential Vcom, for a period from completion of the threshold detection to start of light emission. With this, in the standby period, leak current can be prevented from flowing from the anode terminal of the organic EL element 16 to the power supply line VP1, and the anode potential of the organic EL element 16 can be maintained constant.

(e) Data Writing

The data writing period Wi of the pixel circuits 10 in the i-th row is set in a period from time t4 to time t5. In the data writing period Wi, the potential of the scanning signal line Gi becomes the low level, and the potential of the data signal line Sj becomes a data potential Vdata. At this time, the TFT 11 is in the on state, so that the potential of the node A changes to Vdata. The TFT 13 is in the on state at this time, and the organic EL element 16 has a capacitance value sufficiently larger than that of the capacitor 15. Consequently, even when the potential of the node A changes, the gate potential of the TFT 12 is hardly influenced.

(f) Light Emission Standby

In the light emission standby period, like the data standby period, the scanning signal line Gi becomes the high level, and the potential of the power supply line VP1 becomes VP_C which is substantially equal to the common potential Vcom. At this time, the potential of the node A is Vdata, and the gate potential of the TFT 12 is (VP_C+Vth).

(g) Light Emission

Before time t5, the potential of the control line AZ1 changes to the high level. With the change, the TFT 13 changes to the off state. At time t5, the potential of the control line E1 changes to the low level. With the change, the TFT 14 changes to an on state. At time t5, the potential of the power supply line VP1 changes to VP_H which is higher than the common potential Vcom. Consequently, the potential of the node A changes from Vdata to VP_H. A voltage higher than a light emission threshold voltage is applied to the organic EL element 16, and the organic EL element 16 emits light. The potential VP_H is determined such that the TFT 12 operates in a saturation region in the light emission period. Therefore, the current I flowing through the organic EL element 16 in the light emission period is given by the following equation (1) when a channel length modulation effect is ignored.

$$I = \tfrac{1}{2} \cdot W/L \cdot \mu \cdot Cox(Vgs - Vth)^2 \quad (1)$$

In the equation (1), W is a gate width, L is a gate length, μ is a carrier mobility, Cox is a gate oxide film capacitance, and Vgs is a gate-source voltage.

Since the TFT 13 is in the off state in the light emission period, when the potential of the node A changes from Vdata to VP_H, the gate potential of the TFT 12 changes by the same amount and becomes (VP_C+Vth+VP_H−Vdata). Therefore, the gate-source voltage Vgs of the TFT 12 in the light emission period is given by the following equation (2).

$$Vgs = VP\_C + Vth - Vdata \quad (2)$$

From the equations (1) and (2), the following equation (3) is derived.

$$I = \tfrac{1}{2} W/L \cdot \mu \cdot Cox(VP\_C - Vdata)^2 \quad (3)$$

Although the current I in the equation (3) changes depending on the data potential Vdata, it does not depend on the threshold voltage Vth of the TFT 12. Therefore, even in the case where variation occurs in the threshold voltage Vth or in the case where the threshold voltage Vth changes with time, by making current which does not depend on the threshold voltage Vth flow through the organic EL element 16, the organic EL element 16 can be made to emit light with desired brightness.

(h) Turn Off

At time t6, the potential of the control line E1 changes to the high level. With the change, the TFT 14 changes to an off state. At time t6, the potential of the power supply line VP1 changes to VP_C. Consequently, after time t6, the anode potential of the organic EL element 16 falls. After a while from time t6, the anode potential of the organic EL element 16 becomes sufficiently low, and the organic EL element 16 turns off. Before the next node initialization period, a turn off period having a sufficient length may be provided.

Figure 24:
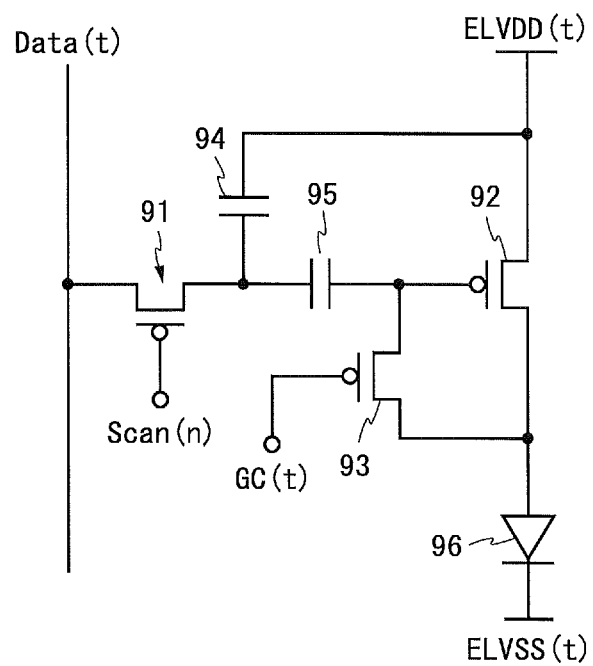
FIG. 24 is a circuit diagram of a pixel circuit included in a conventional display device.

The pixel circuit 10 has a configuration obtained by removing the capacitor 94 from the pixel circuit illustrated in FIG. 24 (hereinbelow, called a conventional pixel circuit) and providing the TFT 14 instead. As described above, the conventional pixel circuit has a problem that when leak current flows through the TFTs 91 and 93, the gate potential of the TFT 92 easily fluctuates. On the other hand, since the pixel circuit 10 does not have the capacitor 94, even when leak current flows through the TFT, the gate potential of the TFT 12 does not easily fluctuate. In addition, in the conventional pixel circuit, the size of the capacitors 94 and 95 has to be increased to prevent fluctuation in the gate potential of the TFT 92. On the contrary, the necessity is small in the pixel circuit 10. Therefore, the layout area of the pixel circuit 10 can be reduced.

As described above, the display device 100 according to the embodiment includes the plurality of pixel circuits 10 each including a light emitting element (the organic EL element 16) and disposed in the row direction and the column direction; the plurality of scanning signal lines G1 to Gn each connected to the pixel circuits 10 in the same row; the plurality of data signal lines S1 to Sm each connected to the pixel circuits 10 in the same column; one or more control lines E1 to Eq each connected to the pixel circuits 10 in a plurality of rows; one or more second control lines AZ1 to AZq each connected to the pixel circuits 10 in the plurality of rows; one or more power supply lines VP1 to VPq each connected to the pixel circuits 10 in the plurality of rows; a drive circuit (a circuit configured by the scanning signal line drive circuit 2, the control circuit 3, and the data signal line drive circuit 5) driving the scanning signal lines, the data signal lines, and the control line(s); and the power supply circuit 4 selectively applying a plurality of potentials to the power supply line(s) VP1 to VPq. The drive circuit and the power supply circuit 4 simultaneously perform initialization to pixel circuits 10 in the plurality of rows, simultaneously perform threshold detection to the pixel circuits 10 in the plurality of rows, sequentially write data to the pixel circuits 10 row by row, and perform a control to make light emitting elements included in the pixel circuits 10 in the plurality of rows emit light in the same period.

The pixel circuit 10 includes a drive transistor (TFT 12) having one conduction terminal connected to the power supply line VPk, and the other conduction terminal connected to one end of the light emitting element; the capacitor 15 having one end connected to a control terminal of the drive transistor; a write control transistor (TFT 11) provided between the other end of the capacitor and the data signal line Sj, and having a control terminal connected to the scanning signal line Gi; a threshold detection transistor (TFT 13) provided between the control terminal and the conduction terminal on the light emitting element side of the drive transistor (the drain terminal of the TFT 12); and a power supply connection transistor (TFT 14) provided between the other end of the capacitor and the power supply line VPk and having a control terminal connected to the control line Ek. The control terminal of the threshold detection transistor is connected to the second control line AZk, and the other end of the light emitting element is connected to a conductive member (electrode) having the fixed common potential Vcom. The power supply circuit 4 selectively applies three kinds of potentials to the power supply line(s) VP1 to VPq.

According to the display device 100 of the embodiment, a display device which simultaneously performs initialization to pixel circuits in a plurality of rows, simultaneously performs threshold detection to the pixel circuits in the plurality of rows, sequentially writes data to the pixel circuits row by row, and makes light emitting elements included in the pixel circuits in the plurality of rows emit light in the same period can be configured by using the pixel circuit 10 including four transistors, one capacitor, and a light emitting element, one kind of power supply line(s) VP1 to VPq each connected to the pixel circuits 10 in the plurality of rows, and two kinds of the control lines E1 to Eq and AZ1 and AZq each connected to the pixel circuits 10 in the plurality of rows. Thus, the display device in which the layout area of the pixel circuit is small and the light emitting elements in the pixel circuits in a plurality of rows are made to emit light in the same period can be configured. In addition, by using one kind of power supply line(s), the layout area of the power supply line can be reduced.

Hereinafter, the case of q>1 will be described as a modification of the display device 100 according to the embodiment. As examples, the case of q=2 (first and second modifications) and the case of q=3 (third modification) will be described. As will be described, by using four or more control lines and two or more power supply lines, the data writing period and the light emission period can be made longer than those in the case of using two control lines and one power supply line.

Figure 6:
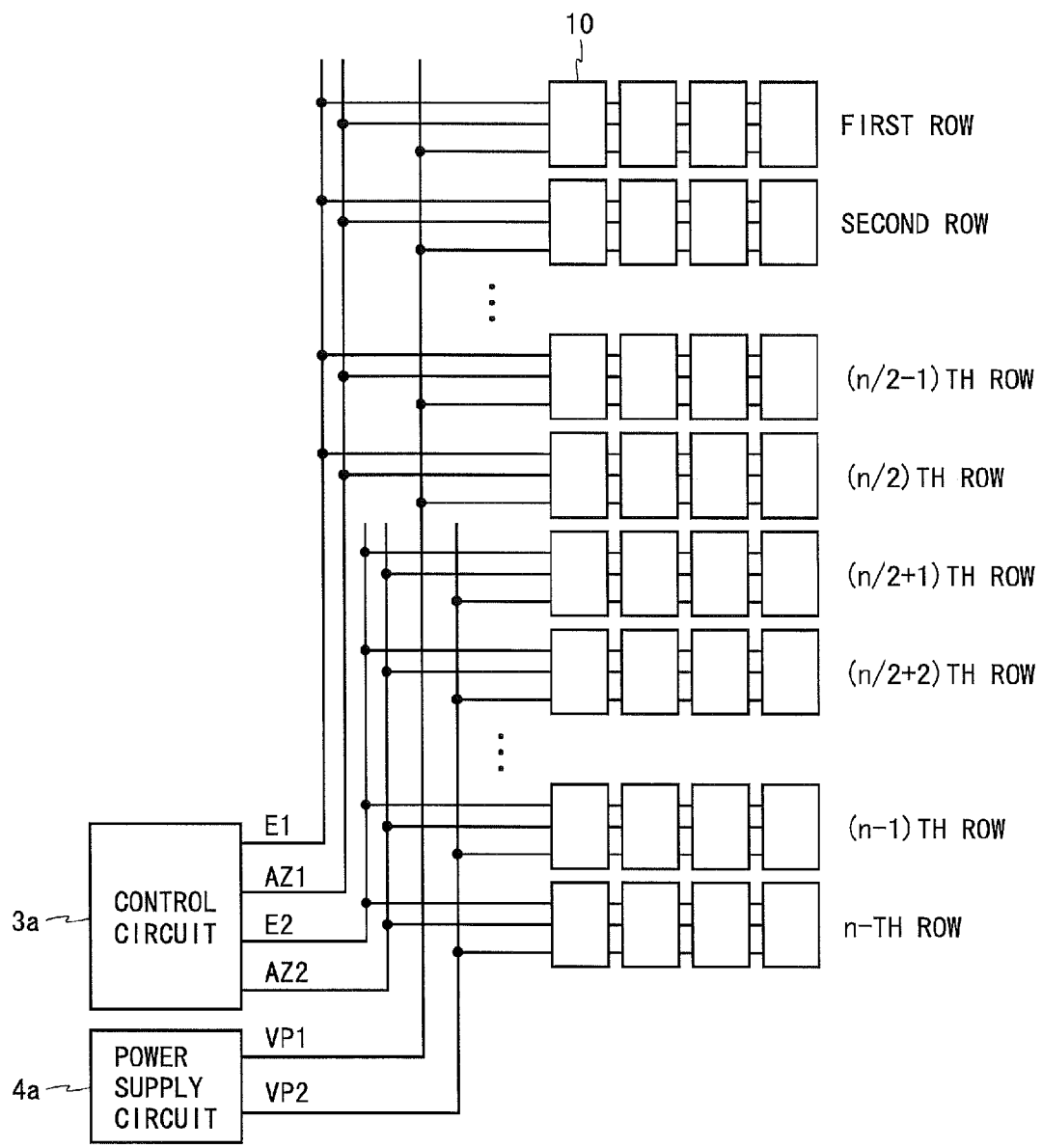
FIG. 6 is a diagram illustrating a connection form of control lines and power supply lines in a display device according to a first modification.

FIG. 6 is a diagram illustrating a connection form of control lines and power supply lines in a display device according to a first modification. In this case, the pixel circuits in the first to (n/2)th rows are connected to the control lines E1 and AZ1 and the power supply line VP1, and the pixel circuits in the (n/2+1)th to n-th rows are connected to the control lines E2 and AZ2 and the power supply line VP2. The scanning signal line drive circuit 2, a control circuit 3a, a power supply circuit 4a, and the data signal line drive circuit 5 perform a control such that the pixel circuits 10 in each row perform the following operations.

Figure 7:
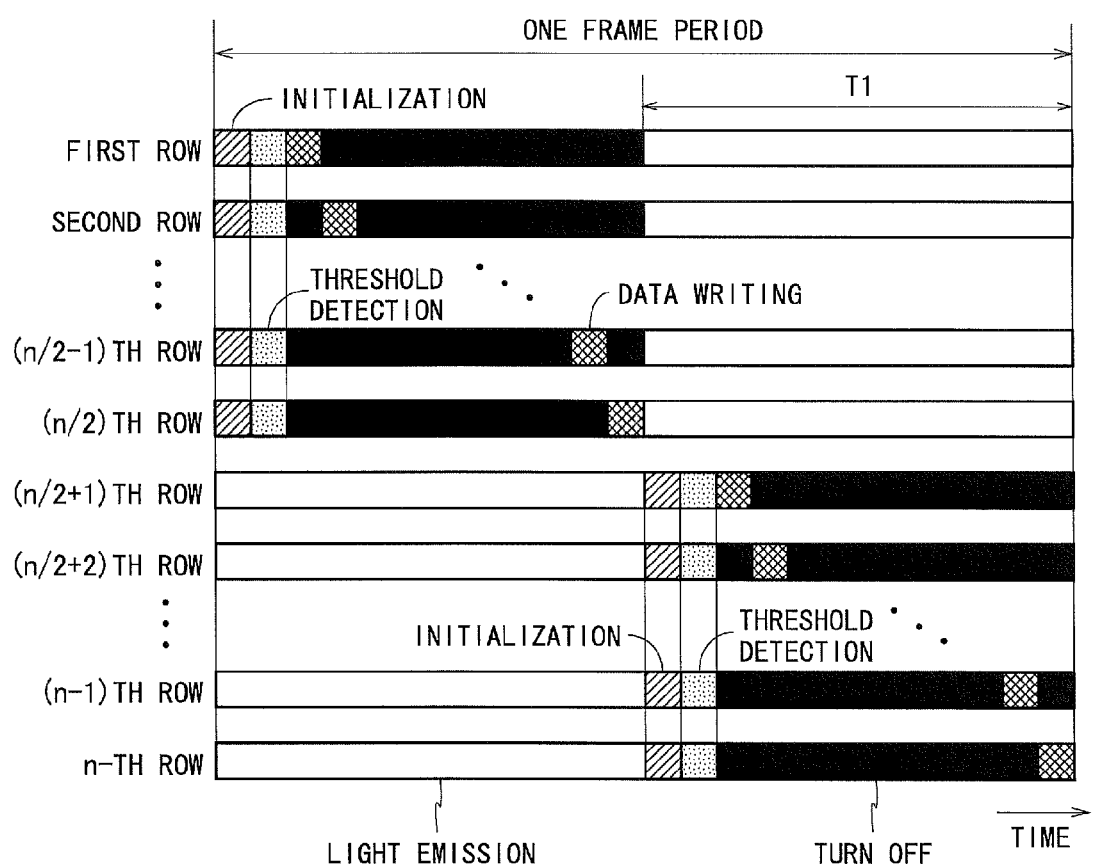
FIG. 7 is a diagram illustrating operations of pixel circuits in each row of the display device according to the first modification.

FIG. 7 is a diagram illustrating the operations of the pixel circuits 10 in each row in the display device according to the first modification. As illustrated in FIG. 7, one frame period is divided into a first period (former part) and a second period (latter part). At the head of the first period, initialization and threshold detection are performed to pixel circuits in the first to (n/2)th rows. At the head of the second period, initialization and threshold detection are performed to pixel circuits in the (n/2+1)th to n-th rows. After the first threshold detection, data writing to the pixel circuits in the first to (n/2)th rows is sequentially performed row by row. After the second threshold detection, data writing to the pixel circuits in the (n/2+1)th to n-th rows is sequentially performed row by row. The pixel circuits in the first to (n/2)th rows emit light for time T1 in the second period, and the pixel circuits in the (n/2+1)th to n-th rows emit light for the same time in the first period.

In the display device according to the first modification, in a period obtained by excluding the initialization period and the threshold detection period from the ½ frame period, data writing is performed to pixel circuits in the half of the whole. Therefore, in the display device according to the first modification, by making the period of writing data to the pixel circuits in the rows longer, data writing can be performed more easily.

Figure 8:
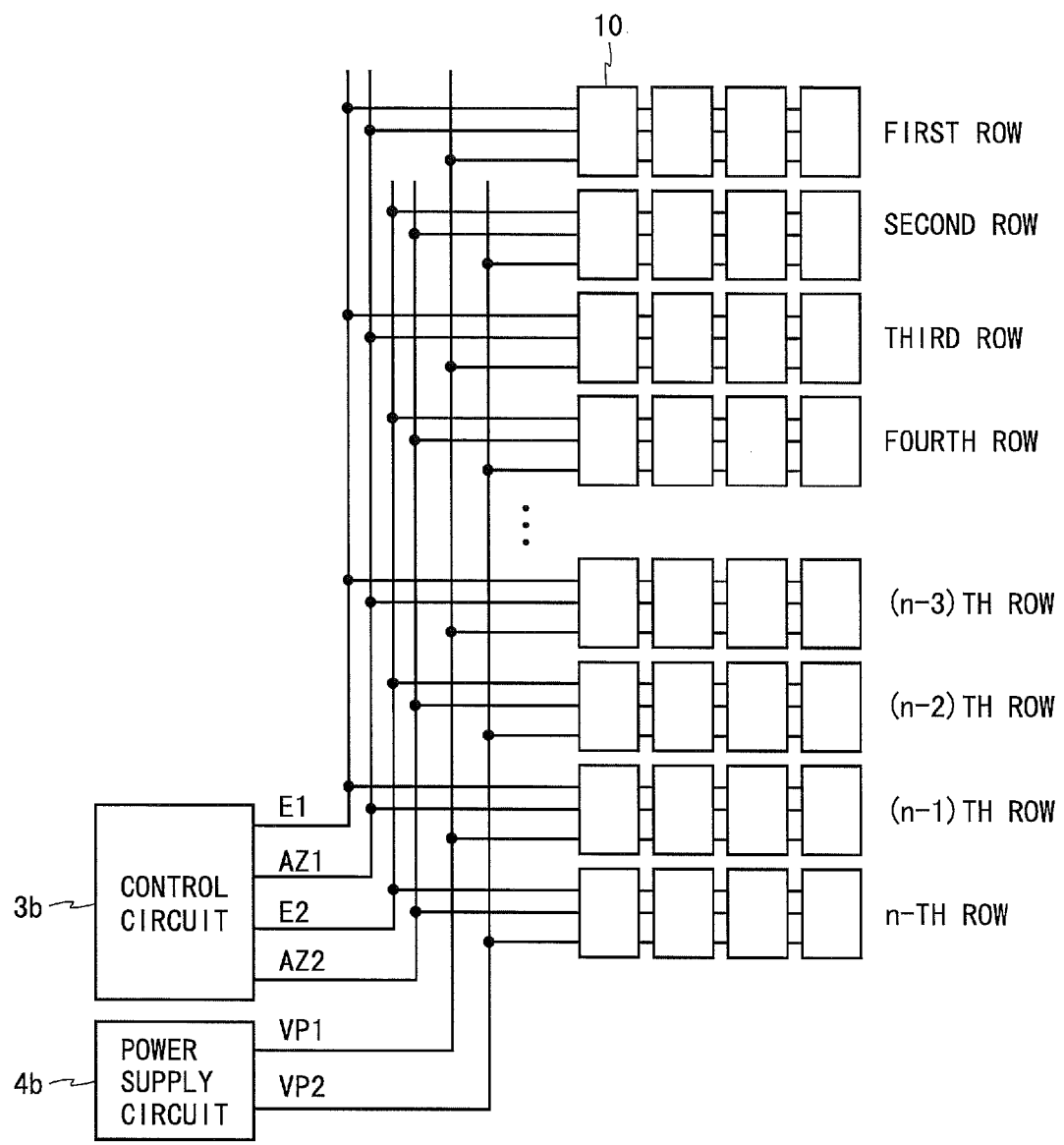
FIG. 8 is a diagram illustrating a connection form of control lines and power supply lines in a display device according to a second modification.

FIG. 8 is a diagram illustrating a connection form of control lines and power supply lines in a display device according to a second modification. In this case, the pixel circuits in the odd-numbered rows are connected to control lines E1 and AZ1 and a power supply line VP1, and the pixel circuits in the even-numbered rows are connected to control lines E2 and AZ2 and a power supply line VP2. The scanning signal line drive circuit 2, a control circuit 3b, a power supply circuit 4b, and the data signal line drive circuit 5 perform a control such that the pixel circuits 10 in each row perform the following operations.

Figure 9:
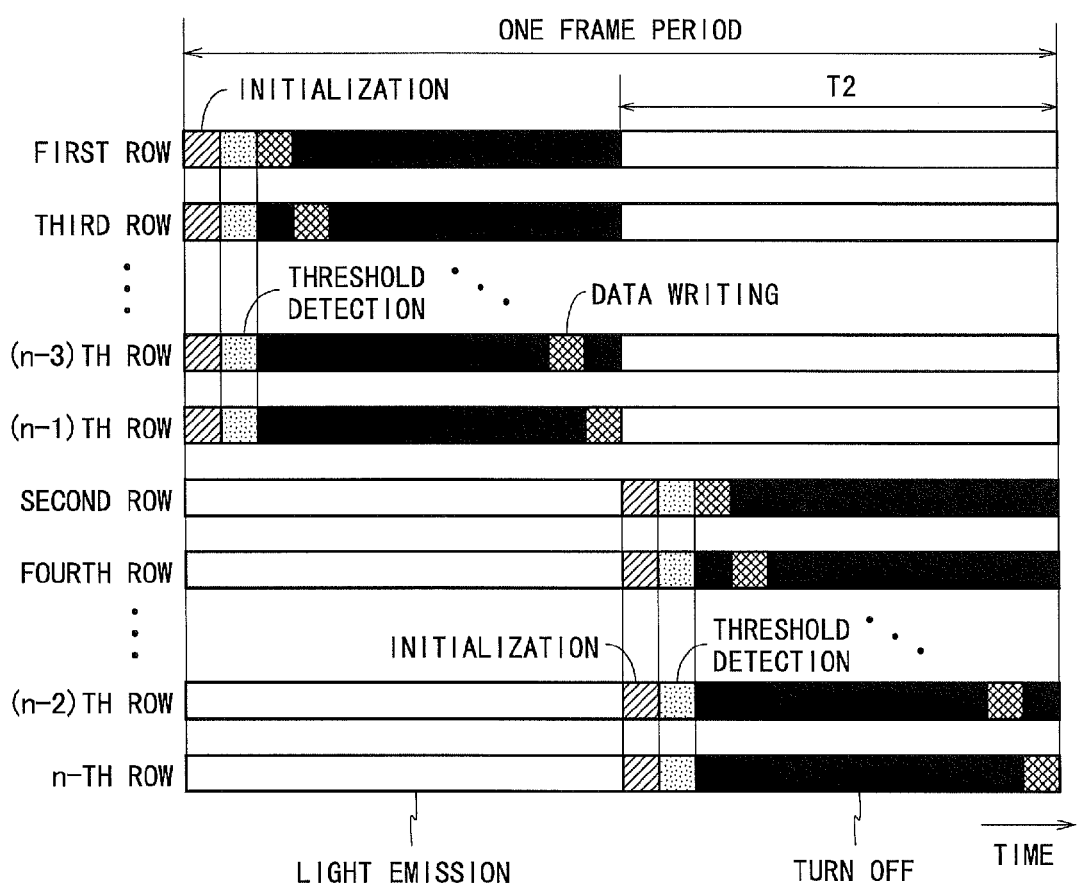
FIG. 9 is a diagram illustrating operations of pixel circuits in each row of the display device according to the second modification.

FIG. 9 is a diagram illustrating the operations of the pixel circuits 10 in each row in the display device according to the second modification. As illustrated in FIG. 9, one frame period is divided into first and second periods. At the head of the first period, initialization and threshold detection are performed to the pixel circuits in the odd-numbered rows. At the head of the second period, initialization and threshold detection are performed to the pixel circuits in the even-numbered rows. After the first threshold detection, data writing to the pixel circuits in the odd-numbered rows is sequentially performed row by row. After the second threshold detection, data writing to the pixel circuits in the even-numbered rows is sequentially performed row by row. The pixel circuits in the odd-numbered rows emit light for time T2 in the second period, and the pixel circuits in the even-numbered rows emit light for the same time in the first period.

In the display device according to the second modification, like the display device according to the first modification, by making the period of writing data to the pixel circuits in the rows longer, data writing can be performed more easily. Also in the case where the brightness in the upper half of the screen and that in the lower half are largely different from each other, the amounts of current flowing through the power supply lines VP1 and VP2 become substantially the same. Therefore, in the display device according to the second modification, the brightness difference which occurs in the center of the screen can be prevented.

Figure 10:
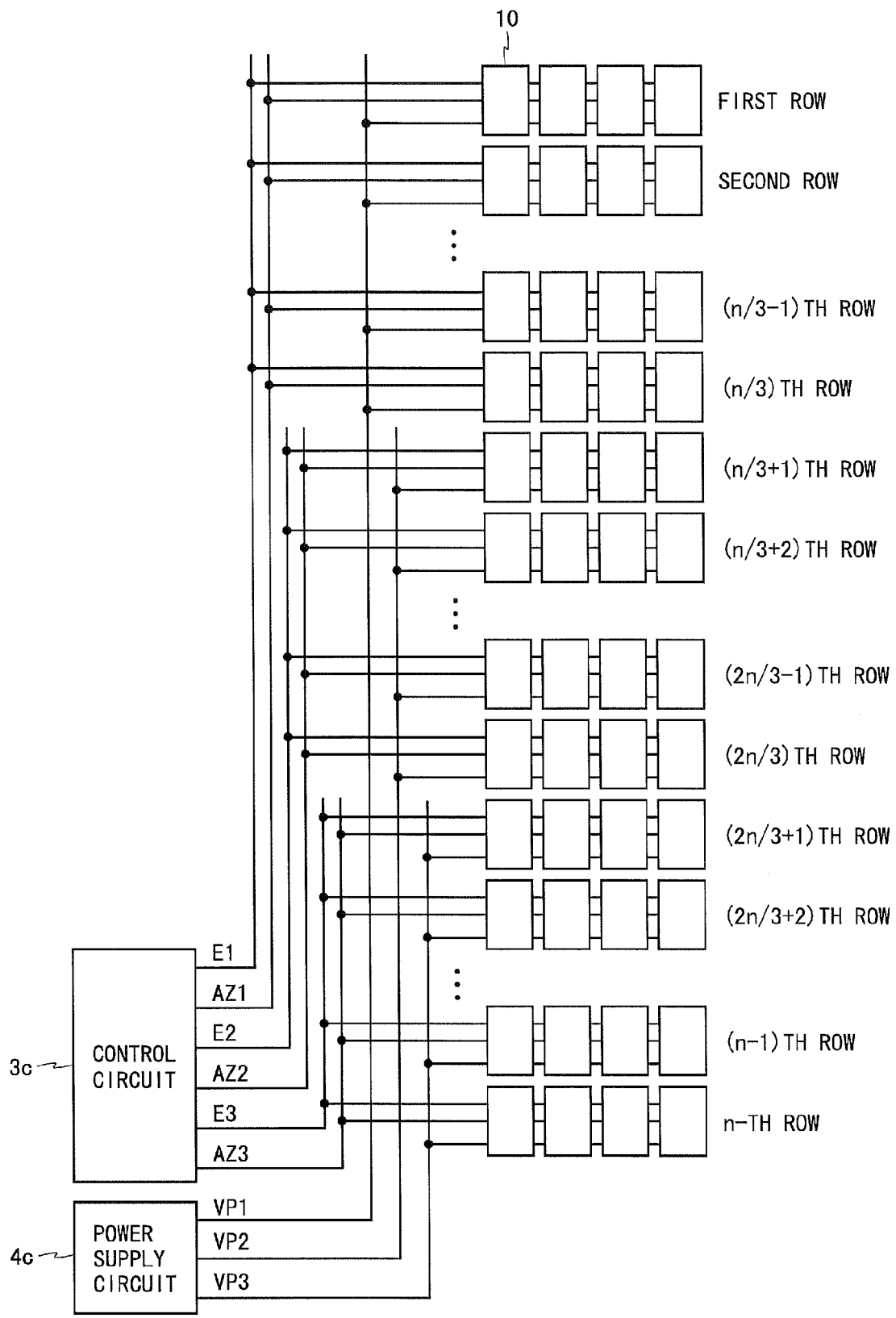
FIG. 10 is a diagram illustrating a connection form of control lines and power supply lines of a display device according to a third modification.

FIG. 10 is a diagram illustrating a connection form of control lines and power supply lines in a display device according to a third modification. In this case, the pixel circuits in the first to (n/3)th rows are connected to control lines E1 and AZ1 and a power supply line VP1, the pixel circuits in the (n/3+1)th to (2n/3)th rows are connected to control lines E2 and AZ2 and a power supply line VP2, and the pixel circuits in the (2n/3+1)th to n-th rows are connected to control lines E3 and AZ3 and a power supply line VP3. The scanning signal line drive circuit 2, a control circuit 3c, a power supply circuit 4c, and the data signal line drive circuit 5 perform a control such that the pixel circuits 10 in each row perform the following operations.

Figure 11:
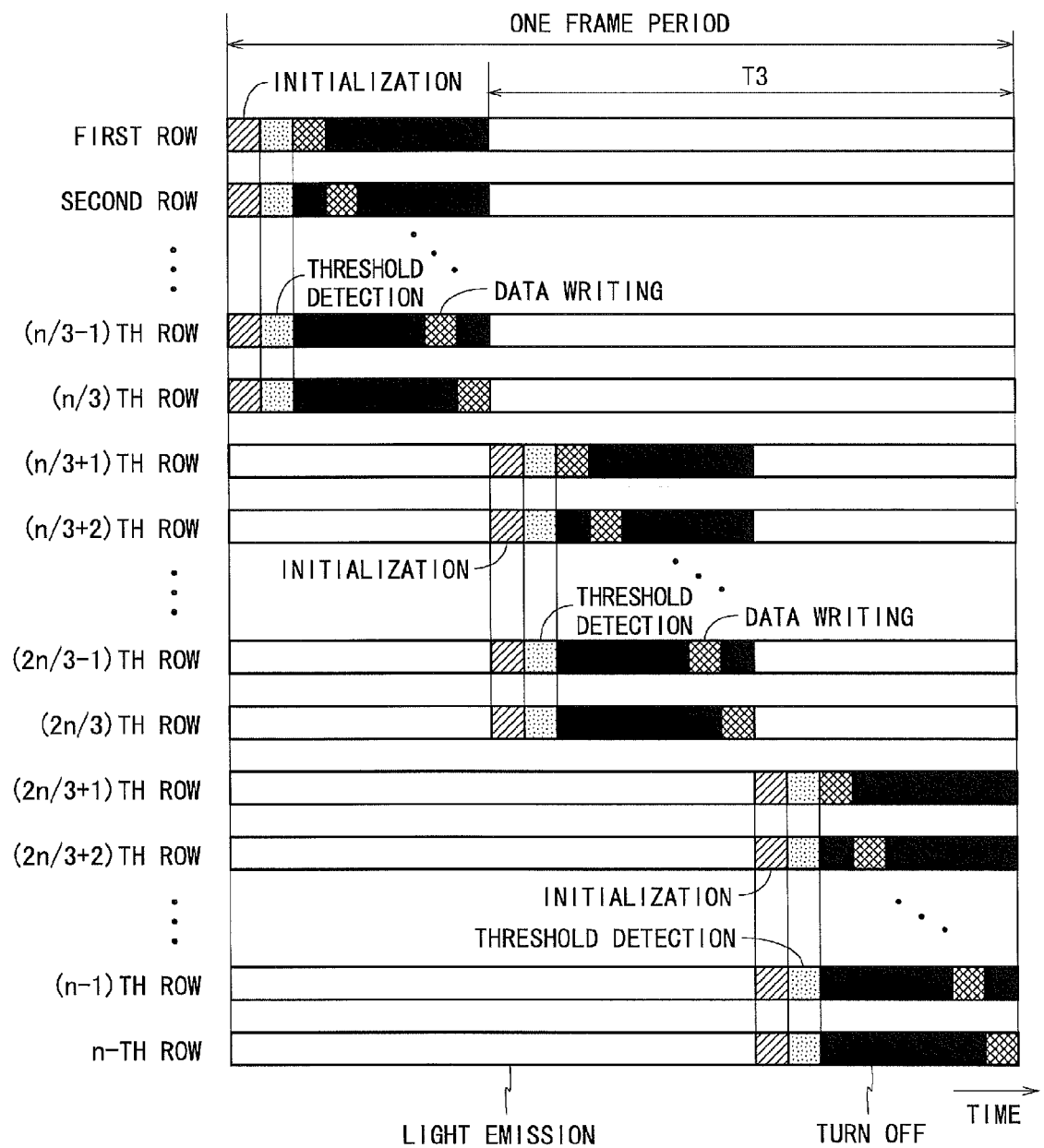
FIG. 11 is a diagram illustrating operations of pixel circuits in each row of the display device according to the third modification.

FIG. 11 is a diagram illustrating the operations of the pixel circuits 10 in each row of the display device according to the third modification. As illustrated in FIG. 11, one frame period is divided into first to third periods. At the head of the first period, initialization and threshold detection are performed to pixel circuits in the first to (n/3)th rows. At the head of the second period, initialization and threshold detection are performed to pixel circuits in the (n/3+1)th to (2n/3)th rows. At the head of the third period, initialization and threshold detection are performed to pixel circuits in the (2n/3+1)th to n-th rows. After the first threshold detection, data writing to the pixel circuits in the first to (n/3)th rows is sequentially performed row by row. After the second threshold detection, data writing to the pixel circuits in the (n/3+1)th to (2n/3)th rows is sequentially performed row by row. After the third threshold detection, data writing to the pixel circuits in the (2n/3+1)th to n-th rows is sequentially performed row by row. The pixel circuits in the first to (n/3)th rows emit light for time T3 in the second and third periods, the pixel circuits in the (n/3+1)th to (2n/3)th rows emit light for the same time in the third and first periods, and the pixel circuits in the (2n/3+1)th to n-th rows emit light for the same time in the first and second periods.

In the display device according to the third modification, the pixel circuits 10 are divided into three groups. During initialization and threshold detection to the pixel circuits in a certain group, the pixel circuits in the remaining two groups emit light. Therefore, in the display device according to the third modification, the light emission period can be increased to ⅔ frame period at the longest.

The value of q may be four or more. In the case of q≥4, the connection form of the control lines E1 to Eq and AZ1 to AZq and the power supply lines VP1 to VPq and the operations of the pixel circuits 10 in each row are similar to the above. In the case of q≥3, pixel circuits in the (n/q) row adjacent in the column direction may be connected to the same control line and the same power supply line. Alternatively, pixel circuits in the (n/q) rows including every q-th rows in the column direction may be connected to the same control lines and the same power supply line. For example, in the case of q=3, the pixel circuits in the first row, the fourth row, and so on are connected to the control lines E1 and AZ1 and the power supply line VP1, the pixel circuits in the second row, the fifth row, and so on are connected to the control lines E2 and AZ2 and the power supply line VP2, and the pixel circuits in the third row, the sixth row, and so on are connected to the control lines E3 and AZ3 and the power supply line VP3.

In the case of q=1, the initialization period, the threshold detection period, and the light emission period are common to all of the pixel circuits 10. Since initialization, threshold detection, and light emission are performed to all of the pixel circuits 10 at the same timing, the configurations of the control circuit 3 and the power supply circuit 4 can be simplified. On the other hand, in the case of q≥2, the initialization period, the threshold detection period, and the light emission period vary among the groups of the pixel circuits 10. Since initialization, threshold detection, and light emission are performed to each group of the pixel circuits 10 at a different timing, the data writing period and the light emission period can be made longer than those in the case of q=1. The various modifications can be similarly applied not only to the first embodiment but also to the second to fifth embodiments to be described below.

Second Embodiment

A display device according to a second embodiment of the present invention has the same configuration as that of the display device according to the first embodiment (refer to FIG. 1). The display device according to the embodiment has a pixel circuit 20 illustrated in FIG. 12 in place of the pixel circuit 10. To the pixel circuit 20, a potential V0 is supplied by using a not-illustrated power supply line. The potential V0 is an adjustable potential. In each of the following embodiments, the same reference numerals are designated to the same components as those of the foregoing embodiment and their description will be omitted. Hereinafter, the points different from the display device 100 of the first embodiment will be described.

Figure 12:
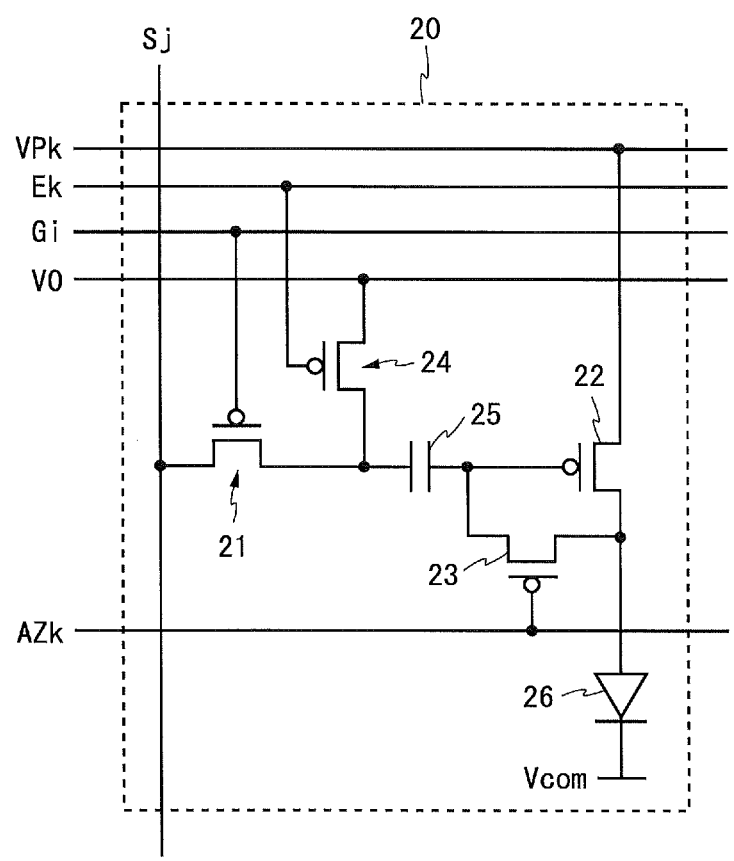
FIG. 12 is a circuit diagram of a pixel circuit included in a display device according to a second embodiment of the present invention.

FIG. 12 is a circuit diagram of the pixel circuit 20. As illustrated in FIG. 12, the pixel circuit 20 includes TFTs 21 to 24, a capacitor 25, and an organic EL element 26. The pixel circuit 20 is connected to the scanning signal line Gi, the data signal line Sj, the control lines Ek and AZk, the power supply line VPk, a power supply line having the potential V0, and an electrode having the common potential Vcom. The connection form of the elements in the pixel circuit 20 is the same as that of the pixel circuit 10 except for the point that the source terminal of the TFT 24 is connected to the power supply line having the potential V0. In the display device of the embodiment, the connection form of the control lines and the power supply line, the operations of the pixel circuits 20 in each row in one frame period, and the timing chart of the pixel circuit 20 are the same as those of the first embodiment (refer to FIGS. 4 to 6).

In the display device according to the embodiment, the power supply connection transistor (TFT 24) in the pixel circuit 20 is provided between one end of the capacitor 25 and the power supply line having the predetermined potential V0. The potential V0 is an adjustable potential. Therefore, the potential V0 can be adjusted to a reference potential of the data signal line drive circuit 5. Furthermore, by adjusting the potential V0, the brightness in the entire display screen can be adjusted.

Third Embodiment

Figure 13:
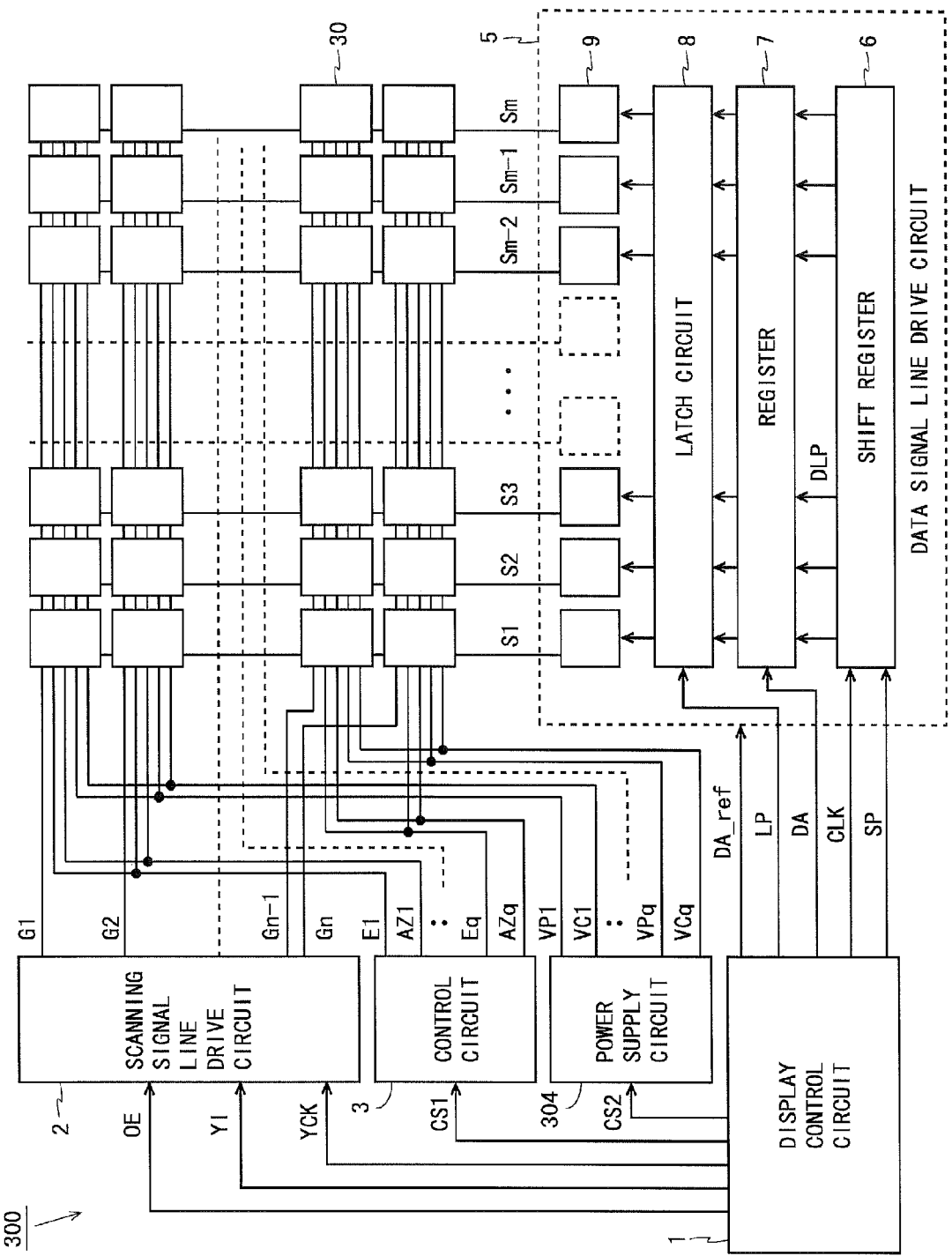
FIG. 13 is a block diagram illustrating a configuration of a display device according to a third embodiment of the present invention.

FIG. 13 is a block diagram illustrating a configuration of a display device according to a third embodiment of the invention. A display device 300 illustrated in FIG. 13 is an organic EL display having the display control circuit 1, the scanning signal line drive circuit 2, the control circuit 3, a power supply circuit 304, the data signal line drive circuit 5, and (m×n) pieces of pixel circuits 30. Hereinafter, the points different from the display device 100 of the first embodiment will be described.

The display device 300 is provided with q pieces of power supply lines VC1 to VCq, in place of the conductive member (electrode) for supplying the common potential Vcom. The pixel circuits 30 in each row are connected to one of the control lines E1 to Eq, one of the control lines AZ1 to AZq, any of the power supply lines VP1 to VPq, and one of the power supply lines VC1 to VCq.

Figure 14:
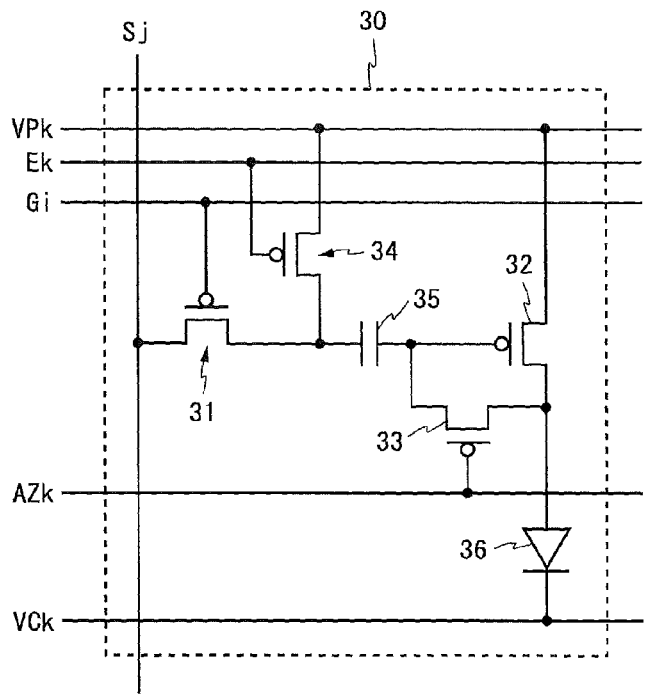
FIG. 14 is a circuit diagram of a pixel circuit included in the display device illustrated in FIG. 13.

Based on the control signal CS2, the power supply circuit 304 selectively applies two kinds of potentials to the power supply lines VP1 to VPq and selectively applies two kinds of potentials to the power supply lines VC1 to VCq. More specifically, the power supply circuit 304 selectively applies the potential VP_C and the potential VP_H higher than the potential VP_C to each of the power supply lines VP1 to VPq, and selectively applies the potential VP_C and a potential VP_S higher than VP_C to each of the power supply lines VC1 to VCq, FIG. 14 is a circuit diagram of the pixel circuit 30. As illustrated in FIG. 14, the pixel circuit 30 includes TFTs 31 to 34, a capacitor 35, and an organic EL element 36. The pixel circuit 30 is connected to the scanning signal line Gi, the data signal line Sj, the control lines Ek and AZk, and the power supply lines VPk and VCk. A connection form of elements in the pixel circuit 30 is the same as that of the pixel circuit 10 except for the point that the cathode terminal of the organic EL element 36 is connected to the power supply line VCk.

Figure 15:
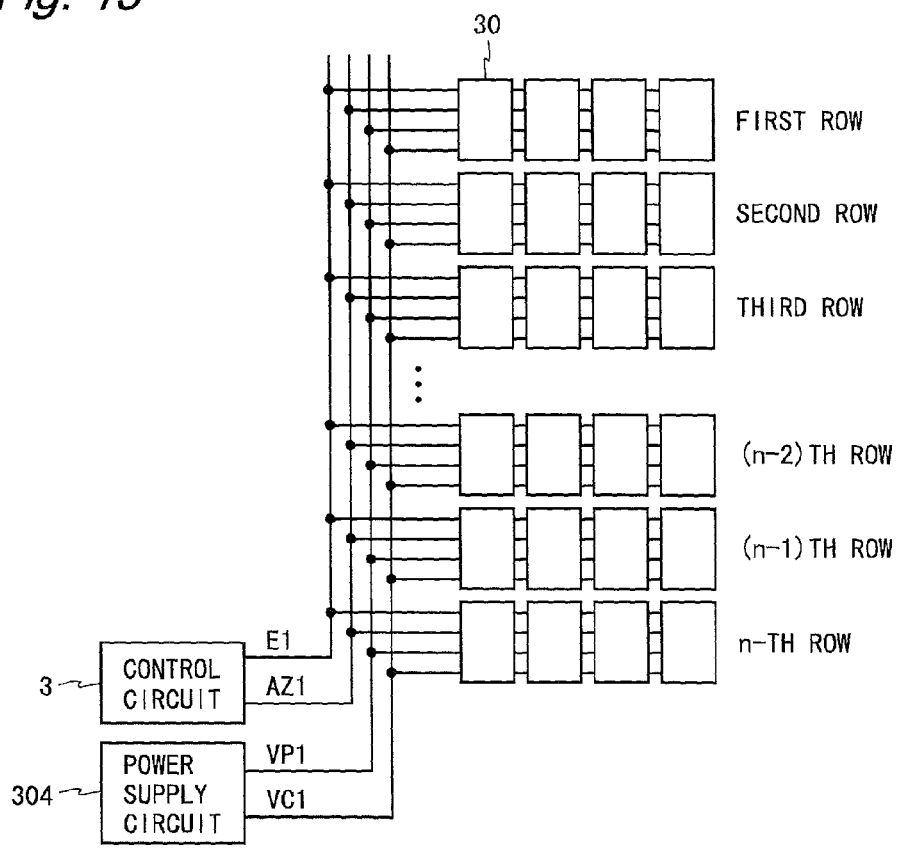
FIG. 15 is a diagram illustrating a connection form of control lines and power supply lines of the display device illustrated in FIG. 13.

Hereinbelow, the case where q=1 will be described. FIG. 15 is a diagram illustrating a connection form of control lines and power supply lines. In this case, all of the pixel circuits 30 are connected to the control lines E1 and AZ1 and the power supply lines VP1 and VC1. The operations of the pixel circuit 30 in each row in one frame period in the display device 300 are the same as those of the first embodiment (refer to FIG. 4).

Figure 16:
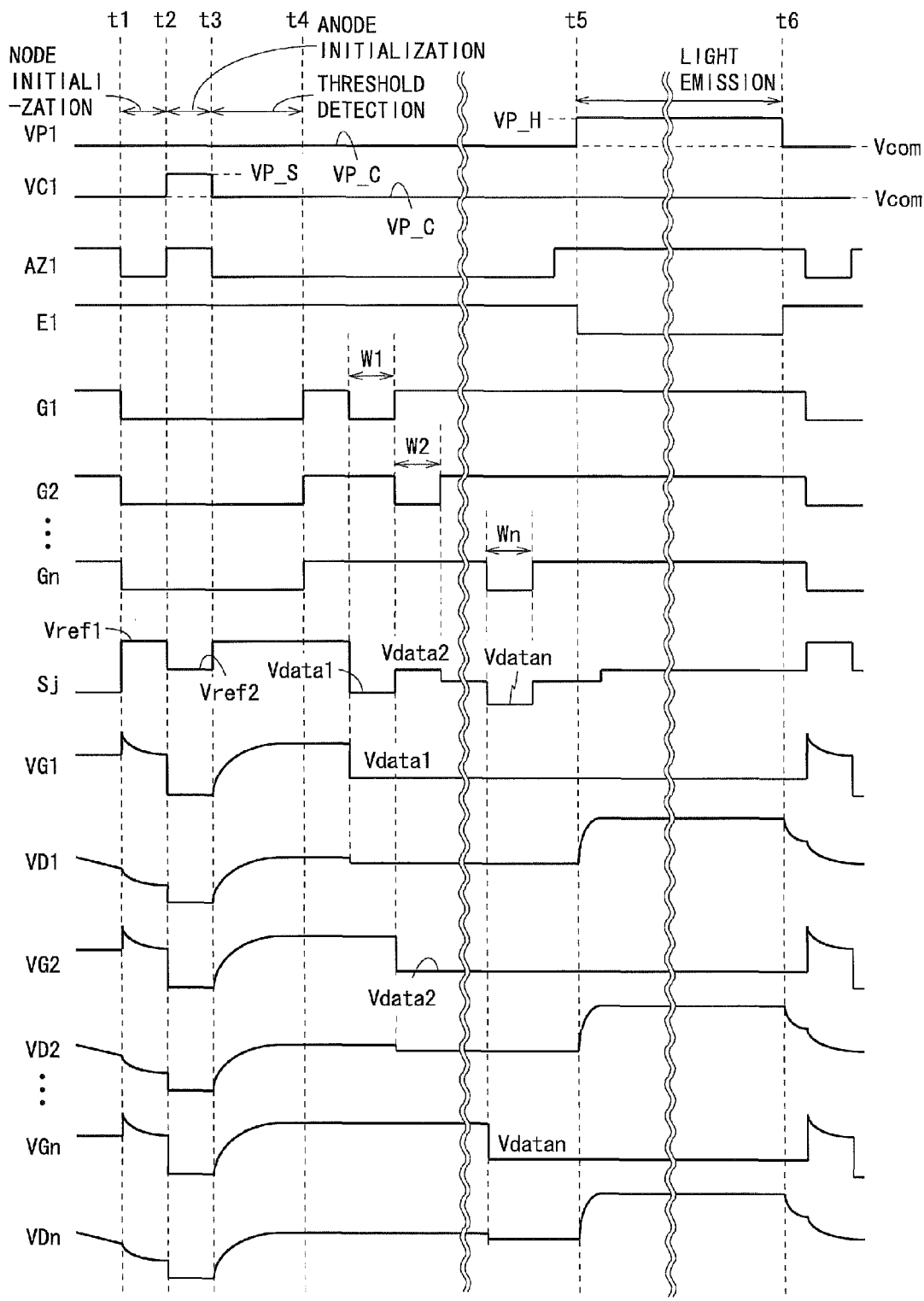
FIG. 16 is a timing chart of the display device illustrated in FIG. 13.

FIG. 16 is a timing chart illustrating the operations of the pixel circuit 30. FIG. 16 is the same as FIG. 5 except for the following points. In FIG. 5, the potential of the power supply line VP1 is VP_H higher than the common potential Vcom in the light emission period, is VP_L lower than Vcom in the anode initialization period, and is VP_C substantially equal to Vcom in the other periods. On the other hand, in FIG. 16, the potential of the power supply line VP1 is VP_H higher than a predetermined potential VP_C in the light emission period and is VP_C in the other periods. The potential of the power supply line VC1 is VP_S higher than VP_C in the anode initialization period and is VP_C in the other periods.

The pixel circuit 30 operates in a manner similar to the pixel circuit 10 according to the first embodiment in the periods other than the anode initialization period. In the anode initialization period, the potential of the power supply line VP1 is VP_C, and the potential of the power supply line VC1 is VP_S higher than VP_C. At this time, the pixel circuit 30 operates in a manner similar to the pixel circuit 10 when the common potential Vcom is applied to the cathode terminal of the organic EL element 16 and the potential of the power supply line VP1 is set to VP_L lower than Vcom. Therefore, the pixel circuit 30 operates in a manner similar to the pixel circuit 10 also in the anode initialization period.

In the display device 100 according to the first embodiment, the power supply circuit 4 selectively applies three kinds of potentials to the power supply lines VP1 to VPq, so that the configuration of the power supply circuit 4 is complicated. On the other hand, in the display device 300 according to the present embodiment, the power supply circuit 304 selectively applies two kinds of potentials to the power supply lines VP1 to VPq and the power supply lines VC1 to VCq respectively. Therefore, in the display device 300 according to the embodiment, the configuration of the power supply circuit 304 can be made simpler than that in the display device 100 according to the first embodiment.

As described above, the display device 300 according to the embodiment includes one or more control lines E1 to Eq each connected to the pixel circuits 30 in a plurality of rows; one or more second control lines AZ1 to AZq each connected to the pixel circuits 30 in the plurality of rows; one or more power supply lines VP1 to VPq each connected to the pixel circuits 30 in the plurality of rows; and one or more second power supply lines VC1 to VCq each connected to the pixel circuits 30 in the plurality of rows. The control terminal of the threshold detection transistor (TFT 33) is connected to the second control line AZk, and one end of the light emitting element (the cathode terminal of the organic EL element 36) is connected to the second power supply line VCk. The power supply circuit 304 selectively applies two kinds of potentials to the power supply line(s) VP1 to VPq and the second power supply line(s) VC1 to VCq respectively.

According to the display device 300 of the embodiment, a display device in which light emitting elements in the pixel circuits in a plurality of rows emit light in the same period can be provided by using the pixel circuit 30 including four transistors, one capacitor, and a light emitting element, two kinds of control lines E1 to Eq and AZ1 to AZq each connected to the pixel circuits 30 in the plurality of rows, and two kinds of power supply lines VP1 to VPq and VC1 to VCq each connected to the pixel circuits 30 in the plurality of rows. By using the power supply circuit 304 selectively applying two kinds of potentials, the configuration of the power supply circuit can be made simple.

Fourth Embodiment

Figure 17:
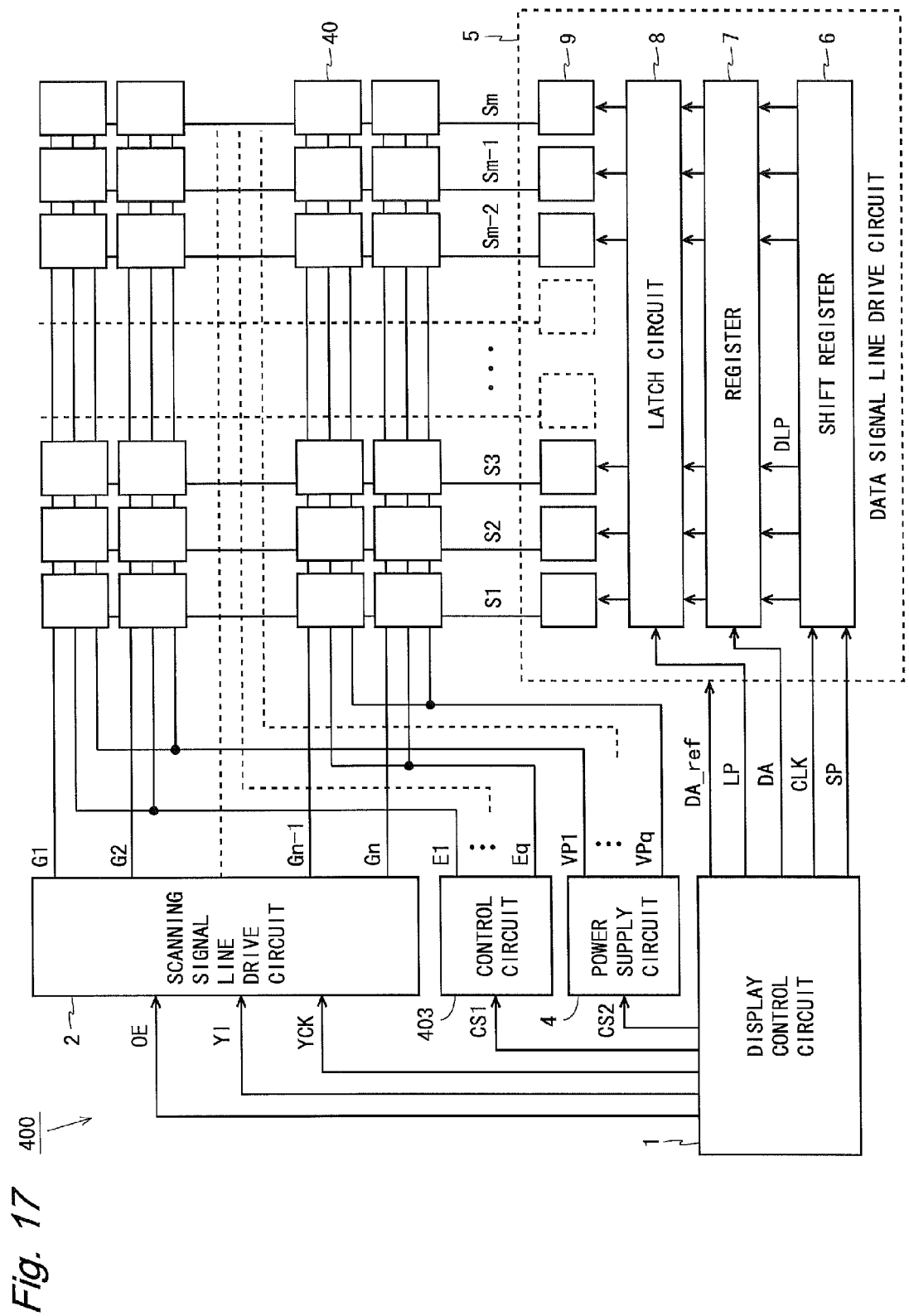
FIG. 17 is a block diagram illustrating a configuration of a display device according to a fourth embodiment of the present invention.

FIG. 17 is a block diagram illustrating a configuration of a display device according to a fourth embodiment of the invention. A display device 400 illustrated in FIG. 17 is an organic EL display having the display control circuit 1, the scanning signal line drive circuit 2, a control circuit 403, the power supply circuit 4, the data signal line drive circuit 5, and (m×n) pieces of pixel circuits 40. Hereinafter, the points different from the display device 100 of the first embodiment will be described.

The display device 400 is provided with, as control lines, q pieces of control lines E1 to Eq. The pixel circuits 40 in each row are connected to one of the control lines E1 to Eq and one of the power supply lines VP1 to VPq. In the display device 400, the control lines AZ1 to AZq are made common to the control lines E1 to Eq. The control circuit 403 selectively applies the high-level potential and the low-level potential to the control lines E1 to Eq based on the control signal CS1.

Figure 18:
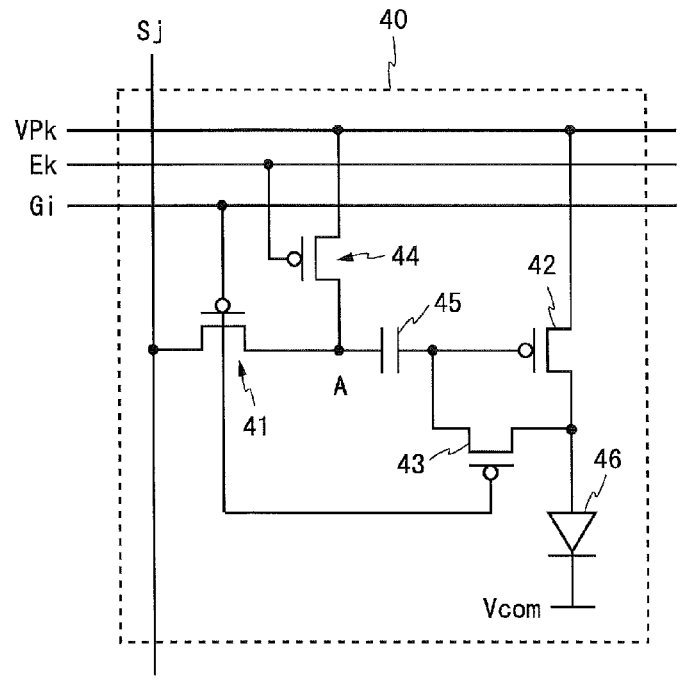
FIG. 18 is a circuit diagram of a pixel circuit included in the display device illustrated in FIG. 17.

FIG. 18 is a circuit diagram of the pixel circuit 40. As illustrated in FIG. 18, the pixel circuit 40 includes TFTs 41 to 44, a capacitor 45, and an organic EL element 46. The pixel circuit 40 is connected to the scanning signal line Gi, the data signal line Sj, the control line Ek, the power supply line VPk, and an electrode having the common potential Vcom. A connection form of elements in the pixel circuit 40 is the same as that of the pixel circuit 10 except for the point that the gate terminal of the TFT 43 is connected to the scanning signal line Gi.

Figure 19:
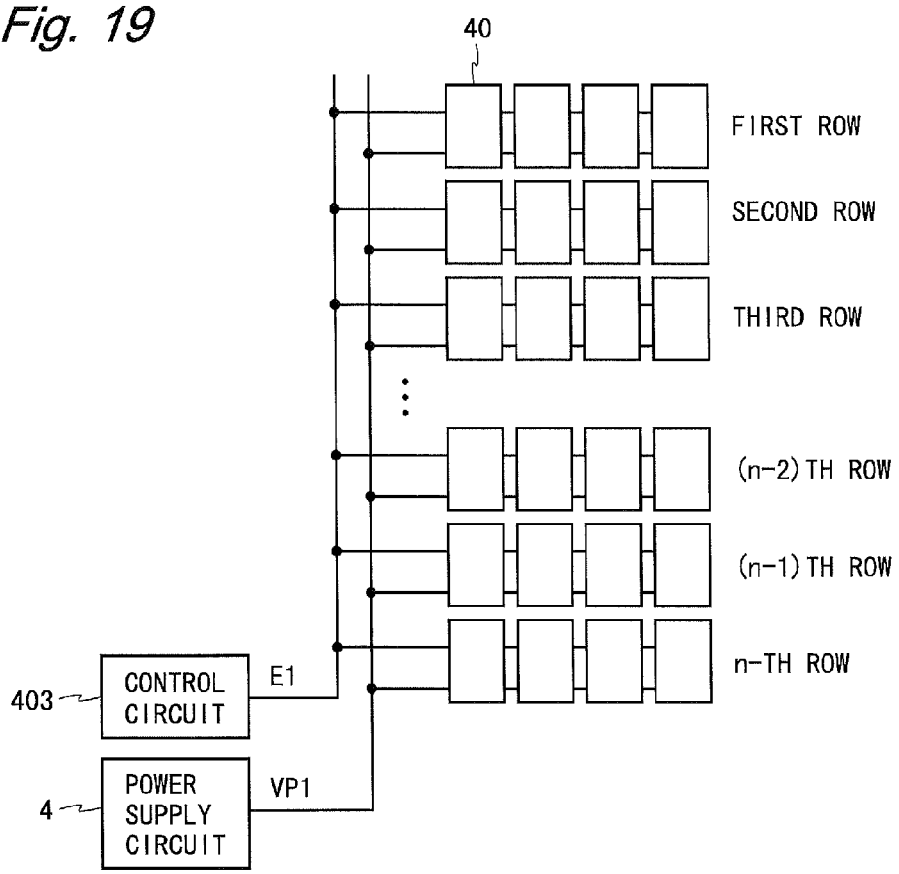
FIG. 19 is a diagram illustrating a connection form of a control line and a power supply line of the display device illustrated in FIG. 17.

Hereinbelow, the case where q=1 will be described. FIG. 19 is a diagram illustrating a connection form of the control line and the power supply line. In this case, all of the pixel circuits 40 are connected to the control line E1 and the power supply line VP1. The operations of the pixel circuit 40 in each row in one frame period in the display device 400 are the same as those of the first embodiment (refer to FIG. 4).

Figure 20:
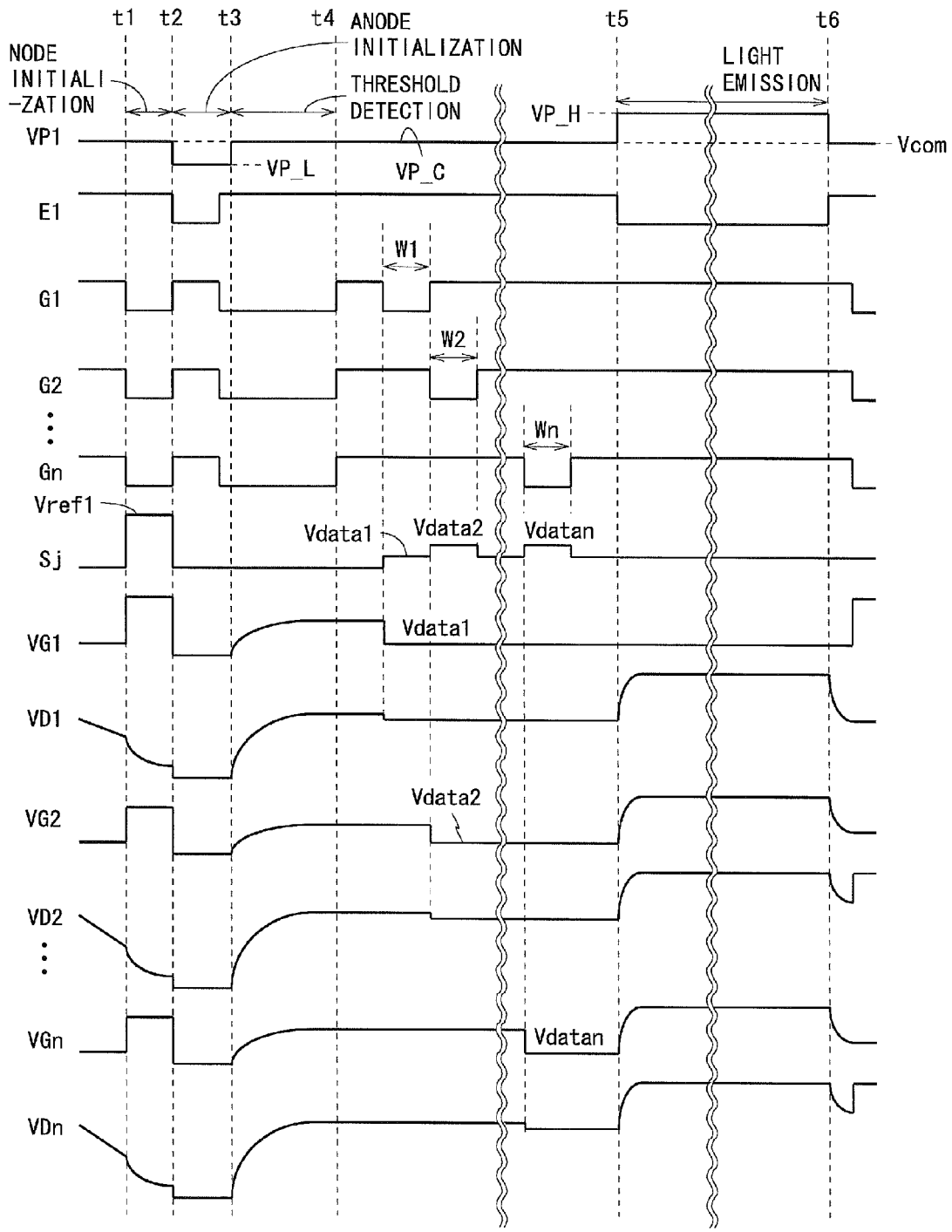
FIG. 20 is a timing chart of the display device illustrated in FIG. 17.

FIG. 20 is a timing chart illustrating the operations of the pixel circuit 40. The meanings of Wi, VGi, and VDi illustrated in FIG. 20 are similar to those in the first embodiment. Hereinafter, with reference to FIG. 20, the operations of the pixel circuit 40 connected to the scanning signal line Gi, the data signal line Sj, the control line E1, and the power supply line VP1 will be described. Before time t1, the potentials of the scanning signal line Gi and the control line E1 are at the high level, and the potential of the power supply line VP1 is VP_C which is substantially equal to the common potential Vcom.

(a) Node Initialization

At time t1, the potential of the scanning signal line Gi changes to the low level. With the change, the TFTs 41 and 43 change to an on state. Between time t1 and time t2, the potential of the power supply line VP1 remains VP_C which is substantially equal to the common potential Vcom, and the potential of the data signal line Sj becomes Vref1. Consequently, the potential of the node A becomes Vref1. The potential Vref1 is determined such that the TFT 41 enters an on state. At this time, the organic EL element 46 does not emit light, so that the anode potential of the organic EL element 46 and the gate potential of the TFT 42 become substantially equal to the common potential Vcom.

(b) Anode Initialization

At time t2, the potential of the scanning signal line Gi changes to the high level, and the potential of the control line E1 changes to the low level. With the change, the TFTs 41 and 43 change to an off state, and the TFT 44 changes to an on state. Between time t2 and time t3, the potential of the power supply line VP1 becomes VP_L which is lower than the common potential Vcom. Consequently, the potential of the node A becomes VP_L. Since the TFT 43 is in the off state, when the potential of the node A falls by (Vref1−VP_L), the gate potential of the TFT 42 falls by the same amount. Accordingly, the TFT 42 enters an on state, and electric charges stored at the anode terminal of the organic EL element 46 is discharged toward the power supply line VP1. As a result, the anode potential of the organic EL element 46 becomes VP_L. Just before time t3, the potential of the scanning signal line Gi changes to the low level, and the potential of the control line E1 changes to the high level. With the change, the TFTs 41 and 43 change to the on state, and the TFT 44 changes to an off state.

(c) Threshold Detection

At time t3, the potential of the power supply line VP1 changes to VP_C which is substantially equal to the common potential Vcom. At this time, current flows from the power supply line VP1 into the gate terminal of the TFT 42 through the TFTs 42 and 43, and the gate potential of the TFT 42 rises. When the threshold voltage of the TFT 42 is assumed to be Vth, the gate potential of the TFT 42 rises to (VP_C+Vth).

(d) Data Standby

At time t4, the potential of the scanning signal line Gi changes to the high level. With the change, the TFTs 41 and 43 change to the off state. At this time point, the anode potential of the organic EL element 46 and the gate potential of the TFT 42 are (VP_C+Vth).

Ideally, in the data standby period, the current does not flow from the anode terminal of the organic EL element 46 to either of the organic EL element 46 side or the power supply line VP1 side, and the anode potential of the organic EL element 46 maintains at (VP_C+Vth). However, without any special contrivance, an unignorable degree of leak current flows through the TFTs 42 and 43 in the data standby period, and the anode potential of the organic EL element 46 fluctuates. Therefore, it is preferable that the power supply circuit 4 sets the potential of the power supply line VP1 to VP_C which is substantially equal to the common potential Vcom, for period from completion of the threshold detection to start of light emission. With this, in the standby period, leak current can be prevented from flowing from the anode terminal of the organic EL element 46 to the power supply line VP1, and the anode potential of the organic EL element 46 can be maintained constant.

(e) Data Writing

The data writing period Wi of the pixel circuits 40 in the i-th row is set in a period from time t4 to time t5. In the data writing period Wi, the potential of the scanning signal line Gi becomes the low level, and the potential of the data signal line Sj becomes a data potential Vdata. At this time, the TFT 41 is in the on state, so that the potential of the node A changes to Vdata. The TFT 43 is in the on state at this time, and the organic EL element 46 has a capacitance value sufficiently larger than that of the capacitor 45. Consequently, even when the potential of the node A changes, the gate potential of the TFT 42 is hardly influenced.

In the case where leak current flows through the organic EL element 46 and the anode potential of the organic EL element 46 falls in the data standby period, the TFT 43 is in the on state in the data writing period, so that the gate potential of the TFT 42 returns to the original level. On the other hand, in the case where the anode potential of the organic EL element 46 rises in the data standby period, the threshold voltage Vth of the TFT 42 cannot be detected correctly. Therefore, in the data standby period, it is preferable that the gate potential of the TFT 42 is equal to or larger than the common potential Vcom.

(f) Light Emission Standby

In the light emission standby period, like the data standby period, the scanning signal line Gi becomes the high level, and the potential of the power supply line VP1 becomes VP_C which is substantially equal to the common potential Vcom. At this time, the potential of the node A is Vdata, and the gate potential of the TFT 42 is (VP_C+Vth).

(g) Light Emission

At time t5, the potential of the control line E1 changes to the low level. With the change, the TFT 44 changes to the on state. At time t5, the potential of the power supply line VP1 changes to VP_H which is higher than the common potential Vcom. Consequently, a voltage higher than the light emission threshold voltage is applied to the organic EL element 46, and the organic EL element 46 emits light. The potential VP_H is determined such that the TFT 42 operates in a saturation region in the light emission period. Therefore, the current I flowing through the organic EL element 46 in the light emission period is given by the above equation (1) when the channel length modulation effect is ignored.

At time t5, the potential of the node A changes from Vdata to VP_H. Since the TFT 43 is in the off state at this time, when the potential of the node A changes from Vdata to VP_H, the gate potential of the TFT 42 changes by the same amount and becomes (VP_C+Vth+VP_H−Vdata). Therefore, the gate-source voltage Vgs of the TFT 42 in the light emission period is given by the above equation (2). From the equations (1) and (2), the above equation (3) is derived.

Although the current I in the equation (3) changes depending on the data potential Vdata, it does not depend on the threshold voltage Vth of the TFT 42. Therefore, even in the case where variation occurs in the threshold voltage Vth or in the case where the threshold voltage Vth changes with time, by making current which does not depend on the threshold voltage Vth flow through the organic EL element 46, the organic EL element 46 can be made to emit light with desired brightness.

(h) Turn Off

At time t6, the potential of the control line E1 changes to the high level. With the change, the TFT 44 changes to the off state. At time t6, the potential of the power supply line VP1 changes to VP_C. Consequently, after time t6, the anode potential of the organic EL element 46 falls. After a while from time t6, the voltage applied to the organic EL element 46 becomes sufficiently low, and the organic EL element 46 turns off.

As a modification of the above-described drive method, there is a method of writing data in a state where the anode potential of the organic EL element 46 is maintained at VP_L without performing threshold detection collectively. Also in the case of using the method, the gate potential of the TFT 42 becomes (VP_C+Vth) after completion of the data writing, regardless of the data potential.

As described above, the display device 400 according to the embodiment has one or more control lines E1 to Eq each connected to the pixel circuits 40 in a plurality of rows and one or more power supply lines VP1 to VPq each connected to the pixel circuits 40 in the plurality of rows. The control terminal of the threshold detection transistor (TFT 43) is connected to the scanning signal line Gk, and one end of the light emitting element (the cathode terminal of the organic EL element 46) is connected to a conductive member (electrode) having the fixed common potential Vcom. The power supply circuit 4 selectively applies three kinds of potentials to the power supply line(s) VP1 to VPq.

According to the display device 400 of the embodiment, a display device in which light emitting elements in the pixel circuits in a plurality of rows emit light in the same period can be provided by using the pixel circuit 40 including four transistors, one capacitor, and a light emitting element, one kind of power supply line(s) VP1 to VPq each connected to the pixel circuits 40 in a plurality of rows, and one kind of control line(s) E1 to Eq connected to the pixel circuits 40 in the plurality of rows. By using one kind of the control line(s) and one kind of the power supply line(s), the layout area of the control line and the power supply line can be reduced, and the configuration of the control circuit 403 can be made simple.

Fifth Embodiment

Figure 21:
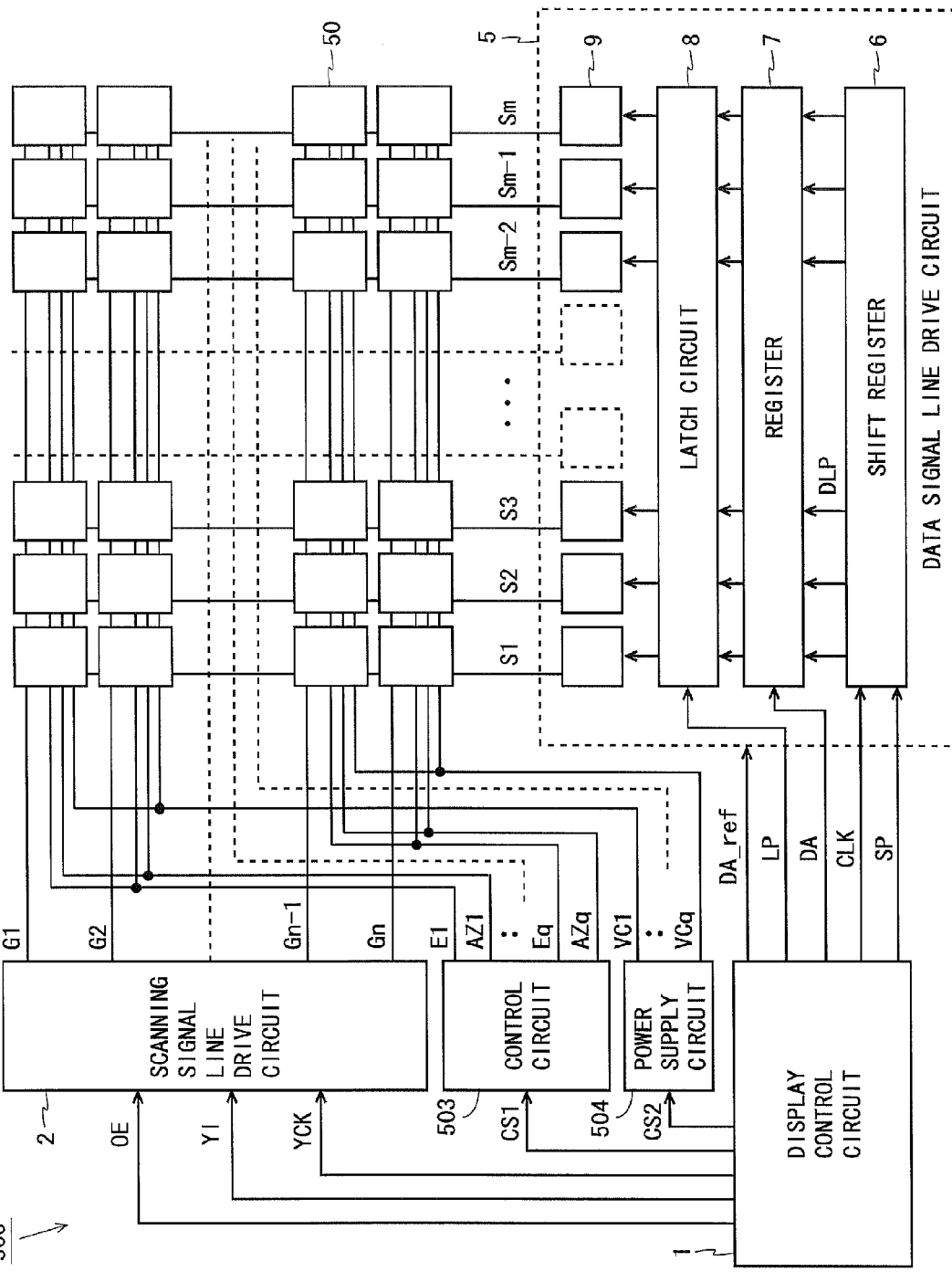
FIG. 21 is a block diagram illustrating a configuration of a display device according to a fifth embodiment of the present invention.

FIG. 21 is a block diagram illustrating a configuration of a display device according to a fifth embodiment of the invention. A display device 500 illustrated in FIG. 21 is an organic EL display having the display control circuit 1, the scanning signal line drive circuit 2, a control circuit 503, a power supply circuit 504, the data signal line drive circuit 5, and (m×n) pieces of pixel circuits 50. Hereinafter, the points different from the display device 100 of the first embodiment will be described.

The display device 500 is provided with, as power supply lines, q pieces of power supply lines VC1 to VCq. The pixel circuits 50 in each row are connected to one of the control lines E1 to Eq, one of the control lines AZ1 to AZq, and one of the power supply lines VC1 to VCq. To the pixel circuit 50, the common potential Vp is supplied by using a not-illustrated conductive member (electrode).

The control circuit 503 selectively applies the high-level potential and the low-level potential to the control lines E1 to Eq and AZ1 to AZq based on the control signal CS1. The power supply circuit 504 selectively applies three kinds of potentials to the power supply lines VC1 to VCq based on the control signal CS2. More specifically, the power supply circuit 504 applies a potential to each of the power supply lines VC1 to VCq, the potential being selected from among the potential VC_H higher than the common potential Vp, the potential VC_C substantially equal to Vp, and the potential VC_L lower than Vp.

Figure 22:
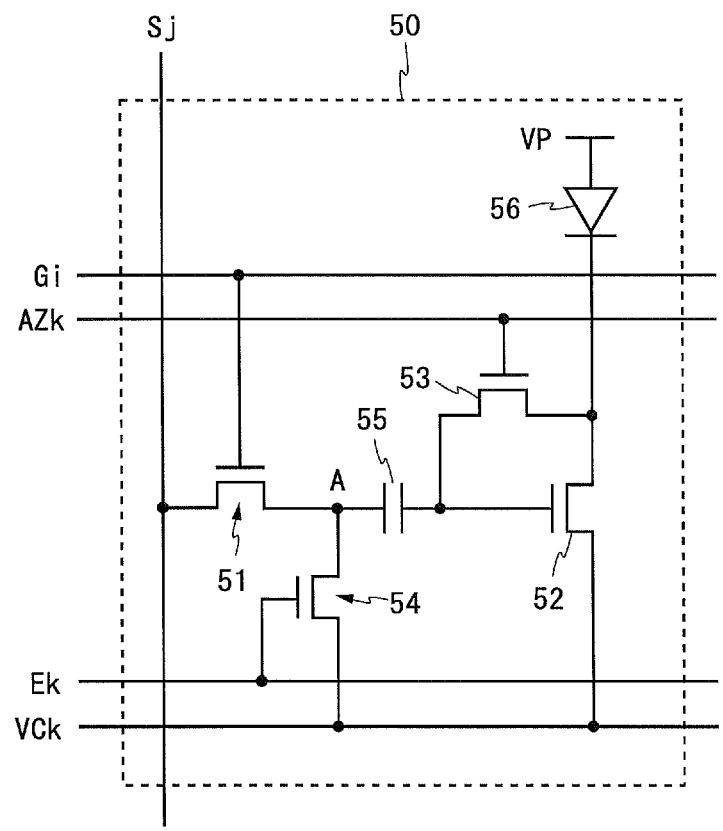
FIG. 22 is a circuit diagram of a pixel circuit included in the display device illustrated in FIG. 21.

FIG. 22 is a circuit diagram of the pixel circuit 50. As illustrated in FIG. 22, the pixel circuit 50 includes TFTs 51 to 54, a capacitor 55, and an organic EL element 56. Each of the TFTs 51 to 54 is an N-channel-type transistor. The pixel circuit 50 is connected to the scanning signal line Gi, the data signal line Sj, the control lines Ek and AZk, the power supply line VCk, and an electrode having the common potential Vp.

One of conduction terminals of the TFT 51 is connected to the data signal line Sj, and the other conduction terminal is connected to one of terminals of the capacitor 55 (hereinbelow, called node A). The other terminal of the capacitor 55 is connected to the gate terminal of the TFT 52. The source terminal of the TFT 52 is connected to the power supply line VCk, and the drain terminal is connected to the cathode terminal of the organic EL element 56. The anode terminal of the organic EL element 56 is connected to the electrode having the common potential Vp. The TFT 53 is provided between the gate terminal and the drain terminal (the conduction terminal on the organic EL element 56 side) of the TFT 52. The drain terminal of the TFT 54 is connected to the node A, and the source terminal is connected to the power supply line VCk. The gate terminal of the TFT 51 is connected to the scanning signal line Gi, the gate terminal of the TFT 53 is connected to the control line AZk, and the gate terminal of the TFT 54 is connected to the control line Ek. The TFTs 51 to 54 function as a write control transistor, a drive transistor, a threshold detection transistor, and a power supply connection transistor, respectively, and the organic EL element 56 functions as alight emitting element.

Figure 23:
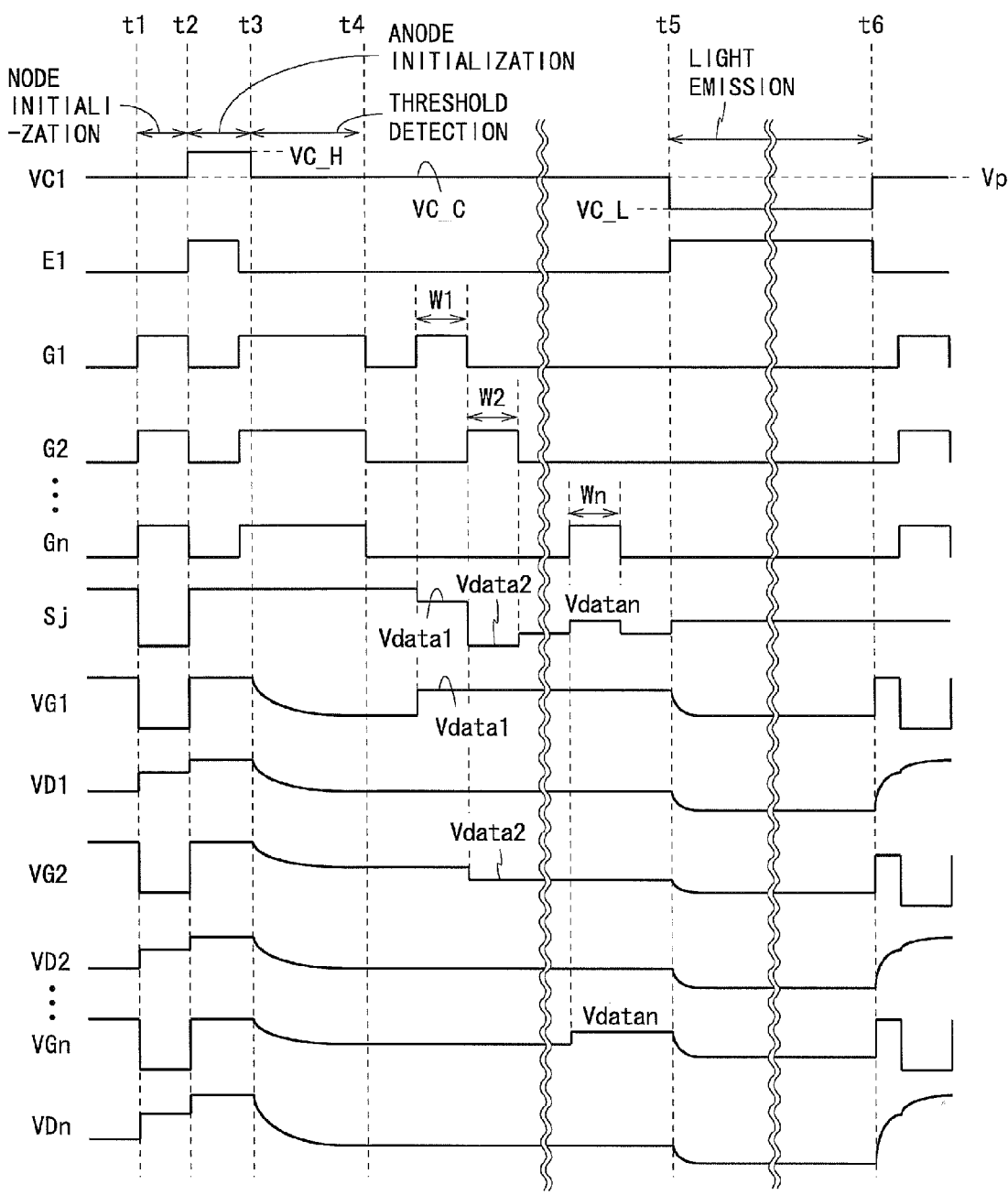
FIG. 23 is a timing chart of the display device illustrated in FIG. 21.

Hereinbelow, the case where q=1 will be described. A connection form of the control lines and the power supply line in the case of q=1 is similar to that of FIG. 3. By replacing the control circuit 3, the power supply circuit 4, and the power supply line VP1 in FIG. 3 with the control circuit 503, the power supply circuit 504, and the power supply line VC1, respectively, the connection form of the embodiment is obtained. FIG. 23 is a timing chart illustrating the operations of the pixel circuit 50. Since the operations of the pixel circuit 50 are similar to those of the pixel circuit 10 in the first embodiment, its description will be omitted here.

According to the display device 500 of the embodiment, in a manner similar to the display device 100 according to the first embodiment, a display device which simultaneously performs initialization to pixel circuits in a plurality of rows, simultaneously performs threshold detection to the pixel circuits in the plurality of rows, sequentially writes data to the pixel circuits row by row, and makes light emitting elements included in the pixel circuits in the plurality of rows emit light in the same period can be configured by using the pixel circuit 50 including four transistors, one capacitor, and a light emitting element, one kind of power supply lines VC1 to VCq each connected to the pixel circuits 50 in the plurality of rows, and two kinds of the control lines E1 to Eq and AZ1 and AZq each connected to the pixel circuits 50 in the plurality of rows. By using one kind of power supply line(s), the layout area of the power supply lines can be reduced.

The pixel circuit 50 is a circuit corresponding to the pixel circuit 10 according to the first embodiment by using N-channel-type transistors. In a similar method, circuits corresponding to the pixel circuits 20, 30, and 40 in the second, third, and fourth embodiments can be configured by using N-channel-type transistors.

As described above, according to the present invention, a display device which simultaneously performs initialization to pixel circuits in a plurality of rows, simultaneously performs threshold detection to the pixel circuits in the plurality of rows, sequentially writes data to the pixel circuits row by row, and makes light emitting elements included in the pixel circuits in the plurality of rows emit light in the same period can be configured by using the pixel circuit including four transistors, one capacitor, and a light emitting element, and a display device in which the layout area of the pixel circuit is small and light emitting elements included in the pixel circuits in the plurality of rows are made to emit light in the same period can be obtained.

INDUSTRIAL APPLICABILITY

The display device of the present invention has characteristics that light emitting elements in pixel circuits in a plurality of rows are made to emit light in the same period and the layout area of the pixel circuit is small. Consequently, the display device can be used as a current drive type display device such as an organic EL display.

DESCRIPTION OF REFERENCE CHARACTERS

1: DISPLAY CONTROL CIRCUIT
2: SCANNING SIGNAL LINE DRIVE CIRCUIT
3, 403, 503: CONTROL CIRCUIT
4, 304, 504: POWER SUPPLY CIRCUIT
5: DATA SIGNAL LINE DRIVE CIRCUIT
6: SHIFT REGISTER
7: REGISTER
8: LATCH CIRCUIT
9: OUTPUT BUFFER
10, 20, 30, 40, 50: PIXEL CIRCUIT
11, 21, 31, 41, 51: TFT (WRITE CONTROL TRANSISTOR)
12, 22, 32, 42, 52: TFT (DRIVE TRANSISTOR)
13, 23, 33, 43, 53: TFT (THRESHOLD DETECTION TRANSISTOR)
14, 24, 34, 44, 54: TFT (POWER SUPPLY CONNECTION TRANSISTOR)
15, 25, 35, 45, 55: CAPACITOR 16, 26, 36, 46, 56: ORGANIC EL ELEMENT (LIGHT EMITTING ELEMENT)
100, 300, 400, 500: DISPLAY DEVICE

The invention claimed is:

1. A current drive type display device, comprising:
a plurality of pixel circuits each including a light emitting element and disposed in a row direction and a column direction;
a plurality of scanning signal lines each connected to the pixel circuits in the same row;
a plurality of data signal lines each connected to the pixel circuits in the same column;
one or more control lines each connected to the pixel circuits in a plurality of rows;
one or more second control lines each connected to the pixel circuits in the plurality of rows;
one or more power supply lines each connected to the pixel circuits in the plurality of rows;
a drive circuit configured to drive the plurality of scanning signal lines, the plurality of data signal lines, the one or more control lines, and the one or more second control lines; and
a power supply circuit configured to selectively apply a plurality of potentials to the one or more power supply lines, wherein
the drive circuit and the power supply circuit are configured to simultaneously perform initialization to the pixel circuits in the plurality of rows, simultaneously perform threshold detection to the pixel circuits in the plurality of rows, sequentially write data to the pixel circuits row by row, and perform a control to make the light emitting elements included in the pixel circuits in the plurality of rows emit light in the same period,
each of the pixel circuits further includes:
a drive transistor having one conduction terminal connected to a power supply line of the one or more power supply lines, and the other conduction terminal connected to one end of the light emitting element;
a capacitor having one end connected to a control terminal of the drive transistor;
a write control transistor provided between the other end of the capacitor and a data signal line of the plurality of data signal lines, and having a control terminal connected to a scanning signal line of the plurality of scanning signal lines;
a threshold detection transistor provided between the control terminal and the conduction terminal on the light emitting element side of the drive transistor, and having a control terminal connected to a control line of the one or more second control lines; and
a power supply connection transistor provided between the other end of the capacitor and the power supply line of the one or more power supply lines or another power supply line having a predetermined potential, and having a control terminal connected to a control line of the one or more control lines,
the other end of the light emitting element is connected to a conductive member having a fixed common potential,
the power supply circuit is configured to selectively apply three kinds of potentials to the one or more power supply lines, and
each of the pixel circuits is configured to be controlled such that
in a former part of an initialization period, the write control transistor is in an on state, the power supply connection transistor is in an off state, and a first potential substantially equal to the common potential is applied to the power supply line of the one or more power supply lines,
in a latter part of the initialization period, the write control transistor is in the on state, the power supply connection transistor is in the off state, a potential with which the drive transistor enters an on state is applied to the data signal line of the plurality of data signal lines, and a second potential for initialization is applied to the power supply line of the one or more power supply lines,
in a threshold detection period, the write control transistor and the threshold detection transistor are in an on state, the power supply connection transistor is in the off state, a potential for threshold detection is applied to the data signal line of the plurality of data signal lines, and the first potential is applied to the power supply line of the one or more power supply lines,
in a period from completion of threshold detection to start of data writing and a period from completion of data writing to start of light emission, the write control transistor and the power supply connection transistor are in the off state,
in a data writing period, the write control transistor and the threshold detection transistor are in the on state, the power supply connection transistor is in the off state, and a data potential is applied to the data signal line of the plurality of data signal lines, and
in a light emission period, the write control transistor and the threshold detection transistor are in an off state, the power supply connection transistor is in an on state, and a third potential for light emission is applied to the power supply line of the one or more power supply lines.

2. A drive method of the current drive type display device according to claim 1, the method comprising:
controlling the pixel circuit such that:
in the former part of the initialization period, the write control transistor is in the on state, the power supply connection transistor is in the off state, and a first potential substantially equal to the common potential is applied to the power supply line,
in the latter part of the initialization period, the write control transistor is in the on state, the power supply connection transistor is in the off state, a potential with which the drive transistor enters the on state is applied to the data signal line, and the second potential for initialization is applied to the power supply line,
in the threshold detection period, the write control transistor and the threshold detection transistor are in an on state, the power supply connection transistor is in the off state, a potential for threshold detection is applied to the data signal line, and the first potential is applied to the power supply line,
in the period from completion of threshold detection to start of data writing and the period from completion of data writing to start of light emission, the write control transistor and the power supply connection transistor are in the off state,
in the data writing period, the write control transistor and the threshold detection transistor are in the on state, the power supply connection transistor is in the off state, and the data potential is applied to the data signal line, and in the light emission period, the write control transistor and the threshold detection transistor are in the off state, the power supply connection transistor is in the on state, and the third potential for light emission is applied to the power supply line.

3. A current drive type display device, comprising:
a plurality of pixel circuits each including a light emitting element and disposed in a row direction and a column direction;
a plurality of scanning signal lines each connected to the pixel circuits in the same row;
a plurality of data signal lines each connected to the pixel circuits in the same column;
one or more control lines each connected to the pixel circuits in a plurality of rows;
one or more second control lines each connected to the pixel circuits in the plurality of rows;
one or more power supply lines each connected to the pixel circuits in the plurality of rows;
one or more second power supply lines each connected to the pixel circuits in the plurality of rows;
a drive circuit configured to drive the plurality of scanning signal lines, the plurality of data signal lines, the one or more control lines, and the one or more second control lines; and
a power supply circuit configured to selectively apply a plurality of potentials to the one or more power supply lines, wherein
the drive circuit and the power supply circuit are configured to simultaneously perform initialization to the pixel circuits in the plurality of rows, simultaneously perform threshold detection to the pixel circuits in the plurality of rows, sequentially write data to the pixel circuits row by row, and perform a control to make the light emitting elements included in the pixel circuits in the plurality of rows emit light in the same period,
each of the pixel circuits further includes:
    a drive transistor having one conduction terminal connected to a power supply line of the one or more power supply lines, and the other conduction terminal connected to one end of the light emitting element;
    a capacitor having one end connected to a control terminal of the drive transistor;
    a write control transistor provided between the other end of the capacitor and a data signal line of the plurality of data signal lines, and having a control terminal connected to a scanning signal line of the plurality of scanning signal lines;
    a threshold detection transistor provided between the control terminal and the conduction terminal on the light emitting element side of the drive transistor, and having a control terminal connected to a control line of the one or more the second control lines; and
    a power supply connection transistor provided between the other end of the capacitor and the power supply line of the one or more power supply lines or another power supply line having a predetermined potential, and having a control terminal connected to a control line of the one or more control lines,
the other end of the light emitting element is connected to a power supply line of the one or more second power supply lines,
the power supply circuit is configured to selectively apply two kinds of potentials to the one or more power supply lines and the one or more second power supply lines respectively, and
each of the pixel circuits is configured to be controlled such that
    in a former part of an initialization period, the write control transistor is in an on state, the power supply connection transistor is in an off state, and a first potential is applied to the power supply line of the one or more power supply lines and the power supply line of the one or more second power supply lines,
    in a latter part of the initialization period, the write control transistor is in the on state, the power supply connection transistor is in the off state, a potential with which the drive transistor enters an on state is applied to the data signal line of the plurality of data signal lines, the first potential is applied to the power supply line of the one or more power supply lines, and a second potential for initialization is applied to the power supply line of the one or more second power supply lines,
    in a threshold detection period, the write control transistor and the threshold detection transistor are in an on state, the power supply connection transistor is in the off state, a potential for threshold detection is applied to the data signal line of the plurality of data signal lines, and the first potential is applied to the power supply line of the one or more power supply lines and the power supply line of the one or more second power supply lines,
    in a period from completion of threshold detection to start of data writing and a period from completion of data writing to start of light emission, the write control transistor and the power supply connection transistor are in the off state,
    in a data writing period, the write control transistor and the threshold detection transistor are in the on state, the power supply connection transistor is in the off state, and a data potential is applied to the data signal line of the plurality of data signal lines, and
    in a light emission period, the write control transistor and the threshold detection transistor are in an off state, the power supply connection transistor is in an on state, a third potential for light emission is applied to the power supply line of the one or more power supply lines, and the first potential is applied to the power supply line of the one or more second power supply lines.

4. A drive method of the current drive type display device according to claim 3, the method comprising:
controlling the pixel circuit such that:
    in the former part of an initialization period, the write control transistor is in the on state, the power supply connection transistor is in the off state, and the first potential is applied to the power supply line and the second power supply line,
    in the latter part of the initialization period, the write control transistor is in the on state, the power supply connection transistor is in the off state, a potential with which the drive transistor enters the on state is applied to the data signal line, the first potential is applied to the power supply line, and the second potential for initialization is applied to the second power supply line,
    in the threshold detection period, the write control transistor and the threshold detection transistor are in the on state, the power supply connection transistor is in the off state, the potential for threshold detection is applied to the data signal line of the plurality of data signal lines, and the first potential is applied to the power supply line of the one or more power supply lines and the power supply line of the one or more second power supply lines, in the period from completion of threshold detection to start of data writing and the period from completion of data writing to start of light emission, the write control transistor and the power supply connection transistor are in the off state, in the data writing period, the write control transistor and the threshold detection transistor are in the on state, the power supply connection transistor is in the off state, and the data potential is applied to the data signal line of the plurality of data signal lines, and in the light emission period, the write control transistor and the threshold detection transistor are in the off state, the power supply connection transistor is in the on state, the third potential for light emission is applied to the power supply line of the one or more power supply lines, and the first potential is applied to the power supply line of the one or more second power supply lines.

5. A current drive type display device, comprising:

a plurality of pixel circuits each including a light emitting element and disposed in a row direction and a column direction;

a plurality of scanning signal lines each connected to the pixel circuits in the same row;

a plurality of data signal lines each connected to the pixel circuits in the same column;

one or more control lines each connected to the pixel circuits in a plurality of rows;

one or more power supply lines each connected to the pixel circuits in the plurality of rows;

a drive circuit configured to drive the plurality of scanning signal lines, the plurality of data signal lines, and the one or more control lines; and a power supply circuit configured to selectively apply a plurality of potentials to the one or more power supply lines, wherein the drive circuit and the power supply circuit are configured to simultaneously perform initialization to the pixel circuits in the plurality of rows, simultaneously perform threshold detection to the pixel circuits in the plurality of rows, sequentially write data to the pixel circuits row by row, and perform a control to make the light emitting elements included in the pixel circuits in the plurality of rows emit light in the same period, each of the pixel circuits further includes:

a drive transistor having one conduction terminal connected to a power supply line of the one or more power supply lines, and the other conduction terminal connected to one end of the light emitting element;

a capacitor having one end connected to a control terminal of the drive transistor;

a write control transistor provided between the other end of the capacitor and a data signal line of the plurality of data signal lines, and having a control terminal connected to a scanning signal line of the plurality of scanning signal lines;

a threshold detection transistor provided between the control terminal and the conduction terminal on the light emitting element side of the drive transistor, and having a control terminal connected to the scanning signal line of the plurality of scanning signal lines; and a power supply connection transistor provided between the other end of the capacitor and the power supply line of the one or more power supply lines or another power supply line having a predetermined potential, and having a control terminal connected to a control line of the one or more control lines, the other end of the light emitting element is connected to a conductive member having a fixed common potential, the power supply circuit is configured to selectively apply three kinds of potentials to the one or more power supply lines, and each of the pixel circuits is configured to be controlled such that in a former part of an initialization period, the write control transistor and the threshold detection transistor are in an on state, the power supply connection transistor is in an off state, and a first potential substantially equal to the common potential is applied to the power supply line of the one or more power supply lines, in a latter part of the initialization period, the write control transistor and the threshold detection transistor are in an off state, the power supply connection transistor is in an on state, and a second potential for initialization is applied to the power supply line of the one or more power supply lines, in a threshold detection period, the write control transistor and the threshold detection transistor are in the on state, the power supply connection transistor is in the off state, a potential for threshold detection is applied to the data signal line of the plurality of data signal lines, and the first potential is applied to the power supply line of the one or more power supply lines, in a period from completion of threshold detection to start of data writing and a period from completion of data writing to start of light emission, the write control transistor, the threshold detection transistor, and the power supply connection transistor are in the off state, in a data writing period, the write control transistor and the threshold detection transistor are in the on state, the power supply connection transistor is in the off state, and a data potential is applied to the data signal line of the plurality of data signal lines, and in a light emission period, the write control transistor and the threshold detection transistor are in the off state, the power supply connection transistor is in the on state, and a third potential for light emission is applied to the power supply line of the one or more power supply lines.

6. A drive method of the current drive type display device according to claim 5, the method comprising:

controlling the pixel circuit such that:

in the former part of an initialization period, the write control transistor and the threshold detection transistor are in the on state, the power supply connection transistor is in the off state, and the first potential substantially equal to the common potential is applied to the power supply line, in the latter part of the initialization period, the write control transistor and the threshold detection transistor are in the off state, the power supply connection transistor is in the on state, and the second potential for initialization is applied to the power supply line, in the threshold detection period, the write control transistor and the threshold detection transistor are in the on state, the power supply connection transistor is in the off state, the potential for threshold detection is applied to the data signal line, and the first potential is applied to the power supply line, in the period from completion of threshold detection to start of data writing and the period from completion of data writing to start of light emission, the write control transistor, the threshold detection transistor, and the power supply connection transistor are in the off state, in the data writing period, the write control transistor and the threshold detection transistor are in the on state, the power supply connection transistor is in the off state, and the data potential is applied to the data signal line, and in the light emission period, the write control transistor and the threshold detection transistor are in the off state, the power supply connection transistor is in the on state, and the third potential for light emission is applied to the power supply line.

\* \* \* \* \*